United States Patent [19]
Crozier et al.

[11] Patent Number: 5,818,319
[45] Date of Patent: Oct. 6, 1998

[54] MAGNETS FOR MAGNETIC RESONANCE SYSTEMS

[75] Inventors: Stuart Crozier; David M. Doddrell, both of Brisbane, Australia

[73] Assignee: The University of Queensland, Brisbane, Australia

[21] Appl. No.: 576,069

[22] Filed: Dec. 21, 1995

[51] Int. Cl.⁶ .................................. G01V 3/00; H01F 7/20
[52] U.S. Cl. ............................. 335/299; 335/216; 335/301; 324/319
[58] Field of Search ....................... 335/216, 299, 335/301; 324/318–320

[56] References Cited

U.S. PATENT DOCUMENTS

| | | |
|---|---|---|
| 3,569,823 | 3/1971 | Golay . |
| 4,398,150 | 8/1983 | Barjhoux et al. . |
| 4,587,504 | 5/1986 | Brown et al. ........................... 335/216 |
| 4,689,591 | 8/1987 | McDougall . |
| 4,701,736 | 10/1987 | McDougall et al. . |
| 4,833,410 | 5/1989 | Briguet et al. . |
| 4,890,082 | 12/1989 | Fujita . |
| 4,949,043 | 8/1990 | Hillenbrand et al. . |
| 5,014,032 | 5/1991 | Aubert . |
| 5,045,794 | 9/1991 | Dorri et al. . |
| 5,168,211 | 12/1992 | Laukien et al. . |
| 5,276,399 | 1/1994 | Kasten et al. . |
| 5,289,127 | 2/1994 | Doddrell et al. . |
| 5,304,934 | 4/1994 | Laskaris et al. . |
| 5,309,106 | 5/1994 | Miyajima et al. ..................... 324/318 |
| 5,343,182 | 8/1994 | Ohta ....................................... 335/299 |
| 5,410,287 | 4/1995 | Laskaris et al. . |
| 5,416,415 | 5/1995 | Dorri et al. . |
| 5,428,292 | 6/1995 | Dorri et al. . |
| 5,448,214 | 9/1995 | Laskaris . |

FOREIGN PATENT DOCUMENTS

| | | |
|---|---|---|
| 0304188 | 2/1989 | European Pat. Off. . |
| 5-326197 | 12/1993 | Japan . |
| 2070254 | 9/1981 | United Kingdom . |
| 2167190 | 5/1986 | United Kingdom . |
| 94/06034 | 3/1994 | WIPO . |
| 96/13045 | 5/1996 | WIPO . |

OTHER PUBLICATIONS

Corana A, Marchesi M, Martini C and Ridella S, 1987, "Minimizing multimodal functions of continuous variables with the simulated annealing algorithm" *ACM Trans. Soft.* 13:262–280.

Crozier S and Doddrell D M, 1993, "Gradient Coil Design by Simulated Annealing" *J. Magn. Reson.* 103:354–57.

Crozier S Forbes L K and Doddrell D M, 1994a, "The design of short transverse Gradient coils by Simulated Annealing" *J. Magn. Reson.* 10:126–28.

Crozier S, Dodd S and Doddrell D M, 1994b, "The Design of Shielded Quadrupolar Gradient Coils for MRI by Simulated Annealing" *IEEE Trans. Magn.* 30:1242–46.

Eccles C D, Crozier S, Westphal M, and Doddrell D M, 1993, "Temporal Spherical–Harmonic Expansion and Compensation of Eddy–Current Fields Produced by Gradient Pulses", *Journal of Magnetic Resonance*, 103:135–141.

(List continued on next page.)

*Primary Examiner*—Michael L. Gellner
*Assistant Examiner*—Raymond Barrera
*Attorney, Agent, or Firm*—Maurice M. Klee

[57] ABSTRACT

Procedures for designing magnets, including superconducting magnets, shim magnets, and gradient magnets for magnetic resonance systems, are provided. The procedures involve the use of a simulated annealing procedure in which weighted spherical harmonics are included in the procedure's error function. The procedure has resulted in the development of previously unknown magnet designs. In particular, superconducting magnets have been designed which include at least one coil in which the current flow is opposite to that in adjoining coils. Such reversed flow in combination with a relatively large number of coils, e.g., more than 6 coils, have enabled the development of short, yet homogeneous, whole body magnets for use in magnetic resonance imaging (MRI).

17 Claims, 17 Drawing Sheets

OTHER PUBLICATIONS

Garrett, M. W., "Axially Symmetric Systems for Generating and Measuring Magnetic Fields. Part I", *J. of Applied Physics,* 1951, 22:1091–1107.

Ishiyama A, Shimizu A, and Sakahara A, 1994, "An Optimal Design Method for Multi–section Superconducting Magnets using Modified Simulated Annealing", *IEEE Trans. Magn.,* 30:3435–3438.

Kirkpatrick S, Gelatt C D and Vecchi M P, 1983, "Optimization by simulated annealing" *Science* 220:673–680.

Laukien et al., "Superconducting NMR Magnet Design," *Concepts in Magnetic Rsonance,* 6:255–273, 1994.

Marchesi M L, Molinari G, and Repetto M, 1994, "Parallel Simulated Annealing Algorithm for the Design of Magnetic Structures," *IEEE Trans. Magn.,* 30:3439–3442.

Metropolis N, Rosenbluth A W, Rosenbluth M N and Teller A H, 1953, "Equations of state calculations by fast computing machines" *J. Chem. Phys.* 21:1087–1092.

Simkin J and Trowbridge C W, 1992, "Optimizing electromagnetic devices combining direct search methods with simulated annealing" *IEEE Trans. Magn.* 28:1545–48.

Translation of Japanese Publication No. 5–326197 (JP Dec. 1993), Item #18 above.

MAGNETS FOR MAGNETIC RESONANCE SYSTEMS

FIELD OF THE INVENTION

This invention relates to magnets for magnetic resonance systems and to methods for designing and producing such magnets.

BACKGROUND OF THE INVENTION

Magnetic resonance systems are used in the medical field to produce diagnostic anatomical images and in various scientific and technological fields to study the structures of materials and the molecules therein.

When used to produce images, such systems are typically referred to as MRI systems (magnetic resonance imaging systems), and when used to study the spectra produced by specific nuclei, they are referred to as MRS systems (magnetic resonance spectroscopy systems) or high resolution systems. For ease of reference, the abbreviation "NMR" will be used herein to refer collectively to MRI, MRS, and high resolution systems, as well as to other magnetic resonance systems now known or subsequently developed. Discussions of NMR, including magnet systems for use in conducting NMR studies, can be found in, for example, Laukien et al., "Superconducting NMR Magnet Design," *Concepts in Magnetic Resonance,* 6, 255–273, 1994; and Mansfield et al., *NMR in Imaging and Biomedicine,* Academic Press, Orlando, Fla., 1982. See also Golay, U.S. Pat. No. 3,569,823; Briguet et al., U.S. Pat. No. 4,833,410; Fujita, U.S. Pat. No. 4,890,082; Hillenbrand et al., U.S. Pat. No. 4,949,043; Aubert, U.S. Pat. No. 5,014,032; Dorri et al., U.S. Pat. No. 5,045,794; Kasten et al., U.S. Pat. No. 5,276,399; Doddrell et al. U.S. Pat. No. 5,289,127; Laskaris et al., U.S. Pat. No. 5,304,934; Laskaris et al, U.S. Pat. No. 5,410,287; Dorri et al., U.S. Pat. No. 5,416,415; Dorri et al., U.S. Pat. No. 5,428,292; Laskaris, U.S. Pat. No. 5,448,214; and Iwaoka et al., U.K. Patent Application 2,167,190.

The basic components of a magnet system 10 useful for performing magnetic resonance investigations are shown in FIG. 1. The system of this figure is suitable for producing diagnostic images for human studies, similar systems being used for other applications.

System 10 includes magnet housing 12, superconducting magnet 13, shim coils (also referred to herein collectively as the "shim magnet") 14, gradient coils (also referred to herein collectively as the "gradient magnet") 16, RF coils 18, and patient table 20. As is well known in the art, magnet 13 serves to produce a substantially uniform field (the $B_0$ field) in the region of the system where the nuclear magnetic resonance signal will be generated (referred to herein as the "homogeneous region").

Preferably, the uniformity of the field produced by magnet 13 is on the order of about 20 ppm or less prior to shimming for a homogeneous region having a volume of at least about $40 \times 10^3$ cubic centimeters. Shim coils 14 serve to reduce the variation in $B_0$ within the homogeneous region to even lower levels. See, for example, Golay, U.S. Pat. No. 3,569,823.

RF coils 18 are used to generate the NMR signal by irradiation of the particular nuclei under study at the Larmor frequency for those nuclei, e.g., about 100 megahertz for $^1H$ at a $B_0$ of 2.35 Tesla. The RF coils may also be used to receive the NMR signal when generated or separate coils can be used for this purpose if desired. Gradient coils 16 serve to spatially encode the NMR signal, thereby allowing the formation of a multi-dimensional representation of the NMR-responsive parameter under study.

Conventional superconducting magnet systems used for NMR can be broadly classified as being of the horizontal or the vertical type, with the horizontal type being more commonly used for MRI applications and the vertical type for MRS or high resolution applications. Vertical systems are generally constructed from co-cylindrical, multi-winding solenoids of varying lengths, while horizontal magnets are generally constructed of multi-winding coils distributed along the longitudinal axis of the magnet.

FIGS. 2A and 2B show typical constructions for conventional horizontal and vertical superconducting magnets. The multi-winding primary coils are identified by the reference number 22 in FIG. 2A; the multi-winding primary solenoids are identified by the reference number 24 in FIG. 2B. As discussed below, the present invention can be used with both types of magnets.

In modern medical imaging there is a distinct and long-felt need for magnet systems which have a shorter overall length. The typical patient aperture of a conventional MRI machine is a cylindrical space having a diameter of about 0.6–0.8 meters, i.e., just large enough to accept the patient's shoulders, and a length of about 2.0 meters or more. The patient's head and upper torso are normally located near the center of the patient aperture, which means that they are typically about a meter from the end of the magnet system.

Not surprisingly, many patients suffer from claustrophobia when placed in such a space. Also, the distance of the patient's head and torso from the end of the magnet system means that physicians cannot easily assist or personally monitor the patient during a MRI procedure, which can last as long as an hour or two.

In addition to its affects on the patient, the length of the magnet is a primary factor in determining the cost of a MRI machine, as well as the costs involved in the siting of such a machine. In order to be safely used, MRI machines, as well as MRS and high resolution machines, often need to be shielded so that the magnetic fields surrounding the machine at the location of the operator are below FDA specified exposure levels. By means of shielding, the operator can be safely sited much closer to the magnet than in an unshielded system. Longer magnets require more internal shielding and larger shielded rooms for such safe usage, thus leading to higher costs.

The critical problem in trying to make the magnet of a NMR machine shorter (e.g., to make the overall length less than about 1.5 meters) is keeping $B_0$ uniform (e.g., keeping the variation in $B_0$ less than about 20 ppm before any shimming of the basic field produced by the primary magnet) over a large homogeneous region (e.g., a region having a volume of at least about $40 \times 10^3$ cm$^3$). (Note that the diameter of a sphere having a volume of $40 \times 10^3$ cm$^3$ is about 42 cm, which is larger than the regions of the body which normally are imaged, e.g., the head, which has a width of about 20 cm, and the chest cavity, which has a width of about 35 cm.) Prior to the present invention, this combination of a short overall length and a large homogeneous region has not been achievable.

The most commonly used approach for designing conventional NMR magnet systems has involved expanding the longitudinal component of the magnetic field produced by the magnet in terms of Legendre polynomials, the normal basis set in spherical coordinates, and solving a set of simultaneous equations in those polynomials. See Laukien et al., "Superconducting NMR Magnet Design," *Concepts in*

*Magnetic Resonance*, 6, 255–273, 1994. The set of simultaneous equations relate the properties of the coils making up the magnet (e.g., the number of coils, the axial locations of the coils, the number of windings in each coil, and the magnitude of the driving current in the system) to the overall longitudinal field produced by the magnet. The goal of the process is to null spherical harmonics above the lowest order in the homogeneous region, while still producing a $B_0$ value (the lowest order harmonic) which is sufficiently high. Although this procedure has been effective in designing magnet systems having long overall lengths, the procedure has not been able to identify coil properties which will produce the desired $B_0$ homogeneity for short magnets.

Recently, efforts have been made to apply the technique of simulated annealing to the problem of magnet design. See Crozier S and Doddrell D M 1993 Gradient Coil Design by Simulated Annealing *J. Magn. Reson.* 103 354–57; Crozier S, Forbes L K and Doddrell D M 1994a The design of short transverse Gradient coils by Simulated Annealing *J. Magn. Reson.* 10 126–28; Crozier S, Dodd S and Doddrell D M 1994b The Design of Shielded Quadrupolar Gradient Coils for MRI by Simulated Annealing *IEEE Trans. Magn.* 30 1242–46; Simkin J and Trowbridge C W 1992 Optimizing electromagnetic devices combining direct search methods with simulated annealing *IEEE Trans. Magn.* 28 1545–48.

Simulated annealing is a stochastic optimization process in which selected parameters of a system are optimized by minimizing an error function by making small random perturbations in the selected system parameters and using a methodology based on Boltzmann statistics to determine whether or not a particular perturbation is "accepted" for use in the optimization of the system. In addition to perturbing the parameters, the process can also include constraints on one or more of the parameters.

The critical aspects of any simulated annealing process include: 1) the selection of the parameters, 2) the selection of any constraints on the parameters, and 3) the choice of the error function. In the case of magnet design, the selected parameters prior to the present invention have been the axial locations of the coils, the number of windings in each coil, and the magnitude of the driving current passing through the system.

Significantly, prior art simulated annealing procedures have not used the number of coils, the radial sizes of the coils or the winding direction (i.e., the direction of current flow in individual coils) as perturbation parameters. Similarly, the prior art has not applied constraints to the simulated annealing procedure and, in particular, have not constrained the overall length of the magnet.

The error functions used in the prior art have also limited the effectiveness of the simulated annealing technique. In particular, the error function used in Crozier et al. (1993) to design longitudinal gradient coils was a combination of an inductive term, a power term, a sum of field gradients in a longitudinal cross-sectional plane, and, optionally, a longitudinal shielding term. The same error function was used in Crozier et al. (1994a) and Crozier et al. (1994b) in the design of transverse gradient coils and quadrupolar gradient coils, respectively. This error function is deficient because it cannot distinguish between the different harmonic components which make up the overall magnet field and thus its sensitivity to the perturbations of the simulated annealing process is less than optimal. Moreover, this error function cannot be used to design superconducting magnet 13 since it makes the gradient of the field uniform as opposed to making $B_0$ uniform.

The error function used in Simkin et al. was a unweighted sum of field harmonics. The failure to included weighting coefficients in this error function severally limits the usefulness of the Simkin et al. approach. In accordance with the present invention, it has been determined that it is the relative contributions of the various spherical harmonics making up the overall field which are critical in the design of a magnet using simulated annealing. See Example 2 below. Such relative weighting is impossible with the Simkin et al. error function. Furthermore, Simkin et al. provide no mechanism for designing shielded magnets, such shielding being essential for practical NMR systems which satisfy FDA regulations.

SUMMARY OF THE INVENTION

In view of the foregoing, it is an object of the present invention to provide improved methods for designing magnets for magnetic resonance systems, including, in particular, but without limitation, superconducting magnets, gradient magnets, and shim magnets. It is a specific object of the invention to provide improved simulated annealing procedures for the design of such magnets.

It is a further object of the invention to provide superconducting magnets which have a short length and yet a large homogeneous region.

It is another object of the invention to provide superconducting magnets where the sample to be studied, e.g., all or part of the human body, can be introduced into the homogenous region through an aperture whose orientation is not along the longitudinal axis of the superconducting magnet.

It is an additional object of the invention to provide superconducting magnets of the foregoing types which have low external (stray) fields.

It is a further object of the invention to provide shielded and unshielded shim and gradient magnets which have a short length and yet generate a spherical harmonic field component which is substantially pure. Again, with respect to these magnets, it is an object of the invention to provide designs which produce low external (stray) fields.

To achieve these and other objects, the invention provides a simulated annealing procedure for designing a magnet in which the number of coils, the radial sizes of the coils, and the direction of current flow in the coils are used as optimization parameters and the overall length of the magnet is used as a constraint. Further, the procedure uses an error function which includes a weighted sum of spherical harmonic components and which may include longitudinal and transverse shielding terms.

By means of this design procedure entirely new superconducting magnet designs not before available in the art have been achieved. In particular, superconducting magnets having primary coils with opposing current flows have been designed. These designs preferably employ a relatively large number of coils, e.g., more than the standard value of six coils used in essentially all currently available whole body MRI machines. Also, the designs may employ primary coils of varying radii.

In certain of these designs, the primary coils have a biplanar arrangement which allows the sample, e.g., the patient, to be introduced into the homogeneous region along an axis orthogonal to the longitudinal axis of the coils.

Improved shielding magnets are also provided by the improved magnet design procedures of the invention. As with the primary coils, the design procedure has led to shielding coils having opposed current flows, as well as to shielding magnets having relatively large numbers of shielding coils, e.g., more than four shielding coils.

In accordance with the preferred embodiments of the invention, magnets for magnetic resonance systems are designed which have a length to diameter ratio of less than 1.5 and most preferably less than 1.2. In particular, superconducting magnets are provided which have a short overall length, e.g., less than about 1.5 meters and preferably less than about 1.2 meters, and a substantially uniform $B_0$ field, e.g., less than about 20 ppm before any shimming is performed, for a large homogeneous region, e.g., a region whose volume is at least about $40 \times 10^3$ cm$^3$ and preferably at least about $45 \times 10^3$ cm$^3$. When shielded, these superconducting magnets also have low external (stray) fields.

When applied to the design of shim and gradient magnets, the magnet design procedures of the invention have led to the development of magnets having high purity, short length, and low external (stray) fields.

In accordance with other aspects of the invention, the general structure of the novel magnet designs achieved using the improved simulated annealing procedures of the invention is used as the starting point for other processes for designing magnets, such as the simultaneous equations approach discussed above. For example, in accordance with these aspects of the invention, the design process can begin by specifying that the magnet must have at least six coils and at least one coil wherein the current is in an opposite direction to the current in at least one other coil. With this as the starting point, procedures other than simulated annealing are able to achieve magnet designs which they otherwise could not achieve.

The specifics of the magnet design procedures of the invention and examples of the various magnet configurations developed using these procedures are presented below in connection with the discussion of the preferred embodiments of the invention.

The foregoing drawings, which are incorporated in and constitute part of the specification, illustrate the preferred embodiments of the invention, and together with the description, serve to explain the principles of the invention. It is to be understood, of course, that both the drawings and the description are explanatory only and are not restrictive of the invention.

DESCRIPTION OF THE PREFERRED EMBODIMENTS

As discussed above, the method aspects of the present invention relate to the use of an improved simulated annealing procedure to design magnets for magnetic resonance systems. A general flow chart for the procedure is shown in FIG. 3 and a more detailed flow chart is shown in FIG. 4.

Figure 3:
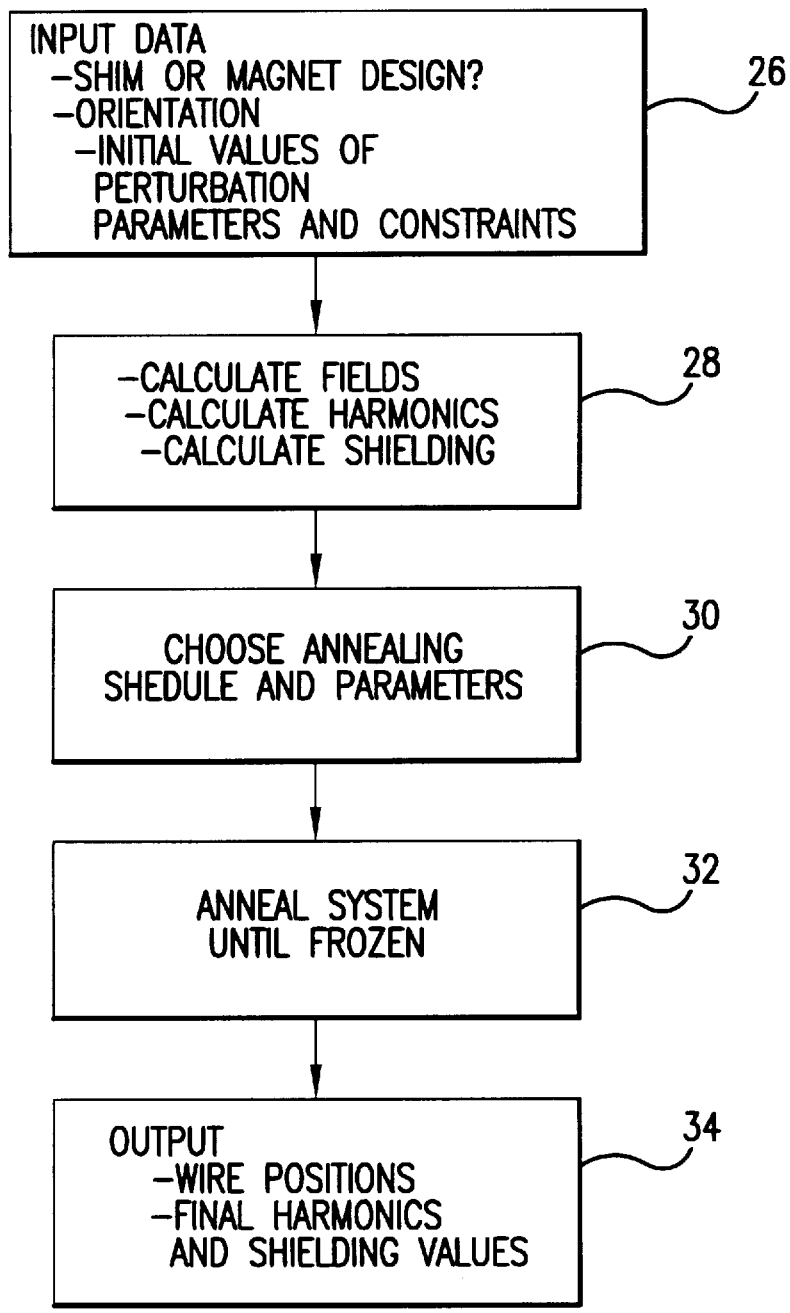
FIG. 3 is a general flow chart for the simulated annealing procedure of the invention.
Figure 4:
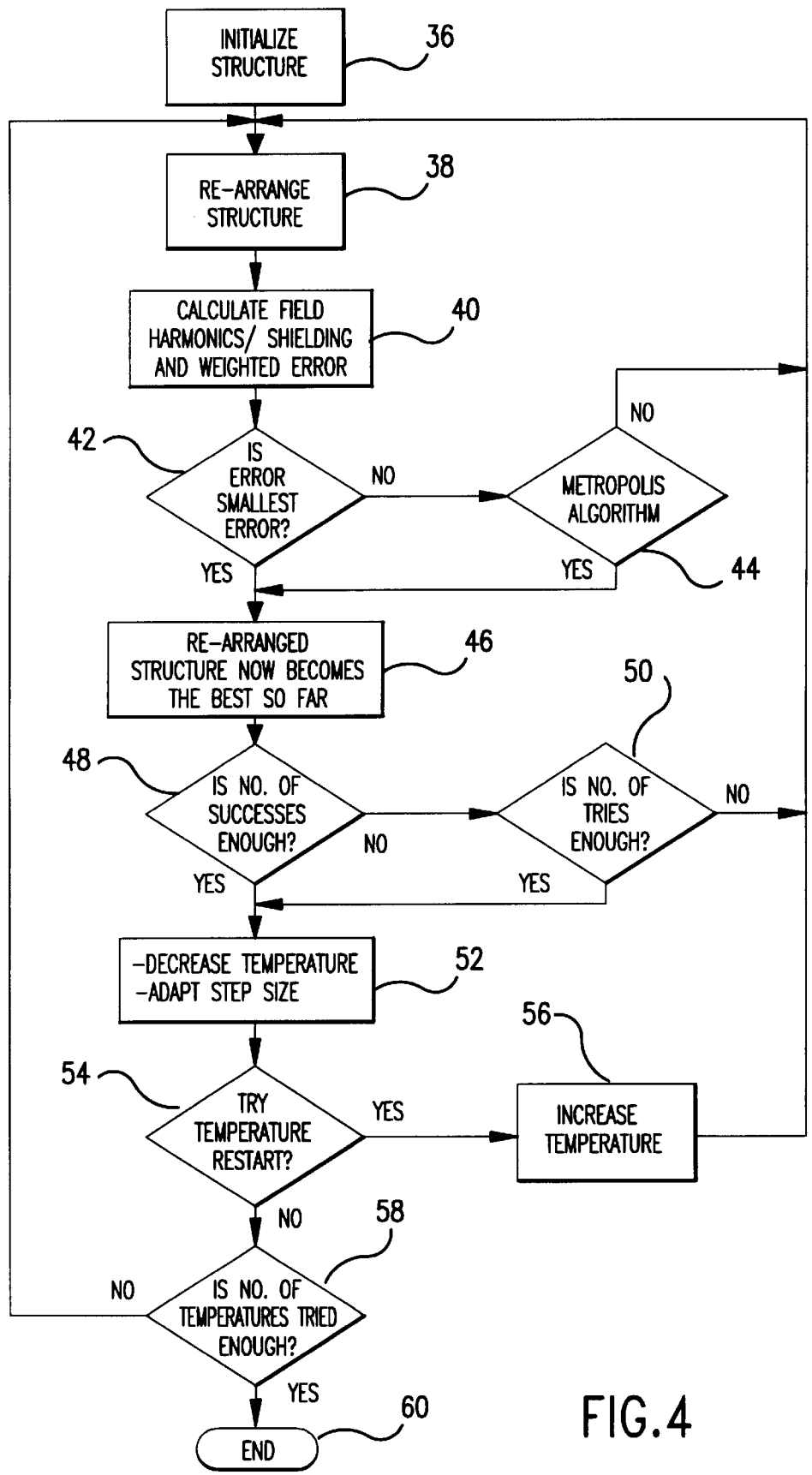
FIG. 4 is a more detailed flow chart for the simulated annealing procedure of the invention.

As shown in FIG. 3, in the first step of the process (box 26), data is inputted to a computer system regarding: (1) the type of magnet which is to be designed, e.g., a superconducting magnet, a shim magnet, or a gradient magnet; (2) the orientation of the magnet, e.g., whether the longitudinal axis of the magnet is to lie in a horizontal or vertical plane with a horizontal orientation generally meaning that the coils of the magnet will be located at discrete locations along the magnet's longitudinal axis and a vertical orientation generally meaning that the coils of the magnet will be in the form of nested solenoids; (3) an initial guess at the parameters which will be perturbed during the simulated annealing process, e.g., the number of coils, the positions of the coils, the number of windings per coil, and the direction of current for each coil; and (4) the constraints on the system, e.g., the length of the magnet, the maximum current in the system, the desired value of $B_0$, and the desired location of the "5 gauss contour line" for shielded magnets. Although not explicitly shown in box 26, the inputted data will also normally include the configuration of the sample (e.g., patient) aperture (e.g., its dimensions and shape) and whether the magnet is to be shielded or not, as well as information regarding the minimum inter-coil spacing, the maximum number of windings per coil, wire thicknesses, and similar information depending on the particular magnet being designed.

With regard to the direction of current for each coil, it should be noted that in a typical superconducting magnet the coils are arranged in series. Accordingly, the direction of flow of current in a coil is determined by the direction in which the coil is wound around the longitudinal axis, as opposed to being determined by the polarity of the feed to each coil. Similarly, in a typical arrangement, the majority of shielding coils are wound in a direction opposite to the direction of winding of the majority of primary coils.

The data input can be performed using any of the standard techniques known in the art for inputting data to a computer system, including, keyboard entry, magnetic medium entry, optical medium entry, and the like.

In the second step of the overall process (box 28 in FIG. 3; see also box 36 of FIG. 4), the initial guess is used to calculate the field at selected field points within and around the magnet. The field values outside the magnet are used to calculate the shielding terms in the simulated annealing error function (see below). The field values inside the magnet are used to calculate the spherical harmonic components of the internal field, and those components are then weighted and used in the simulated annealing error function (see below). The field points inside the magnet are typically selected to lie on the outer boundary, e.g., spherical edge, of the homogeneous region.

The field values inside of the magnet are calculated using the well known Biot-Savart equation which relates the current in various winding segments to field values. (Note that in the typical case, the winding segments will be portions of a circle. However, if the sample aperture has a different shape, the segments are located on paths which correspond to that shape. These considerations, of course, apply to the calculation of both the internal and external fields.) Once the internal field values have been calculated, a spherical harmonic deconvolution is performed. Discussions of spherical harmonics and spherical harmonic deconvolutions can be found in, for example, T. M. MacRobert, *Spherical Harmonics—An Elementary Treatise on Harmonic Functions with Applications*, Metheun, London, 1927; and M. Abramowitz and I. A. Stegun, *Handbook of Mathematical Functions*, National Bureau of Standards, Dover Publications, Inc., New York, 1970.

As is known in the art, a spherical harmonic expansion of a magnetic field expresses the field as a sum of orthogonal terms. The most straightforward approach to obtaining a spherical harmonic expansion of a magnetic field is to determine the magnetic field at points on a spherical surface (the edge of the homogeneous region) surrounding the centre (origin) of the magnet. It should be noted that the centre used for the spherical harmonic expansion need not be the geometric centre of the physical magnet if it is desired to produce a magnet having a "sweet spot" other than at the geometric centre.

Spherical harmonics take the form $$B_{Z_{nm}}(r,\theta,\phi) = r^n(a_{nm}\cos m\phi + b_{nm}\sin m\phi)P_{nm}(\cos\theta) \quad (1)$$

and are solutions of Laplace's equation $\nabla^2 B_Z = 0$. In spherical coordinates, the field $B_Z$ can be represented by an expression of the form $$B_z(r,\theta,\phi) = \sum_n \sum_m B_{z_{nm}}(r,\theta,\phi) \quad (2)$$

NMR is generally concerned with the field in the direction of the magnet axis (the z direction by convention). In equation (1), $Bz_{nm}$ is the spherical harmonic of order n and degree m, $a_{nm}$ and $b_{nm}$ are constants, r is the radial distance from the magnet isocenter and $P_{nm}(\cos\theta)$ are the associated Legendre functions. The spherical harmonic $Bz_{nm}$ and the surface spherical harmonic $T_{nm}$, where $$T_{nm} = (\cos m\phi + \sin m\phi)P_{nm}(\cos\theta) \quad (3)$$

have the property of being orthogonal when integrated over the surface of a sphere, i.e., $$\int_0^{2\pi}\int_{-1}^1 B_{z_{nm}}(u,\phi)T_{ij}(u,\phi)du d\phi \quad (4)$$

$$= 0 \quad n \neq i \text{ or } m \neq j$$

$$= r^n \frac{4\pi}{2n+1} a_{n0} \quad n = i \text{ and } j = m = 0$$

$$= r^n \frac{2\pi}{2n+1} \frac{(n+m)!}{(n-m)!} (a_{nm} + b_{nm}) \quad n = i \text{ and } m = j$$

where $u = \cos\theta$. This integral provides the means by which the spherical harmonic coefficients $a_{nm}$ and $b_{nm}$ can be determined for each spherical harmonic $Bz_{nm}$. In particular, these coefficients can be determined from a field distribution by expanding the left-hand side of equation 4 by substituting equations 1 and 3 to give $$\int_0^{2\pi}\int_{-1}^1 B_z(u,\phi)T_{nm}(u,\phi)du d\phi = \quad (5)$$

$$\int_{-1}^1 P_{nm}(u)\int_0^{2\pi} B_z(u,\phi)(\cos m\phi + \sin m\phi)d\phi du$$

$Bz_{nm}$ having been replaced by the summation given in equation 2. $B_z(u,\phi)$ corresponds to points in the magnetic field which are measured on the surface of a sphere of radius r (the homogeneous region). The inner integral on the right hand side of equation 5 is evaluated by Fourier transforming $B_z(u,\phi)$ with respect to $\phi$ for fixed u to give F(u), while the outer integral is evaluated using Gaussian numerical integration. That is $$\int P_{nm}(u)F(u)du \rightarrow \sum_u P_{nm}(u)W_u(F^c(u) + F^s(u)) \quad (6)$$

where $W_u$ are the Gauss weighting factors for each point u and the superscripts c and s refer to cosine and sine Fourier transforms of the azimuthal data. The coefficients $a_{nm}$ and $b_{nm}$ can then be found by equating terms in expressions 4 and 6 to give:

$$b_{n0} = 0 \quad m = 0 \quad (7)$$

$$a_{n0} = r^{-n}\frac{2n+1}{4\pi}\sum_u P_{n0}(u)W_u F^c(u) \quad m = 0$$

$$a_{nm} = r^{-n}\frac{2n+1}{2\pi}\frac{(n-m)!}{(n+m)!}\sum_u P_{nm}(u)W_u F^c(u) \quad m > 0$$

$$b_{nm} = r^{-n}\frac{2n+1}{2\pi}\frac{(n-m)!}{(n+m)!}\sum_u P_{nm}(u)W_u F^s(u) \quad m > 0$$

Figure 1:
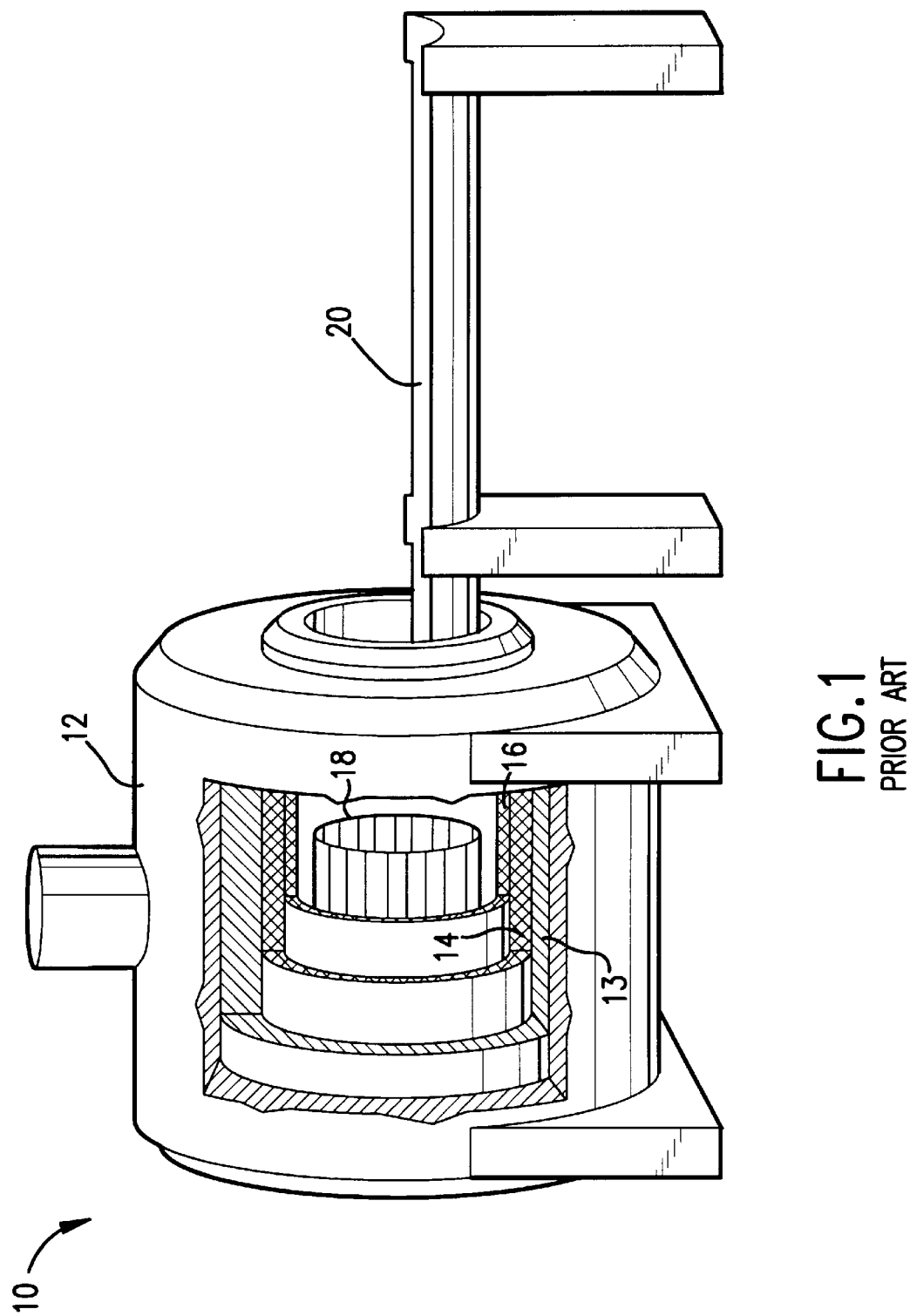
FIG. 1 is a schematic diagram of a prior art MRI machine.
Figure 2A:
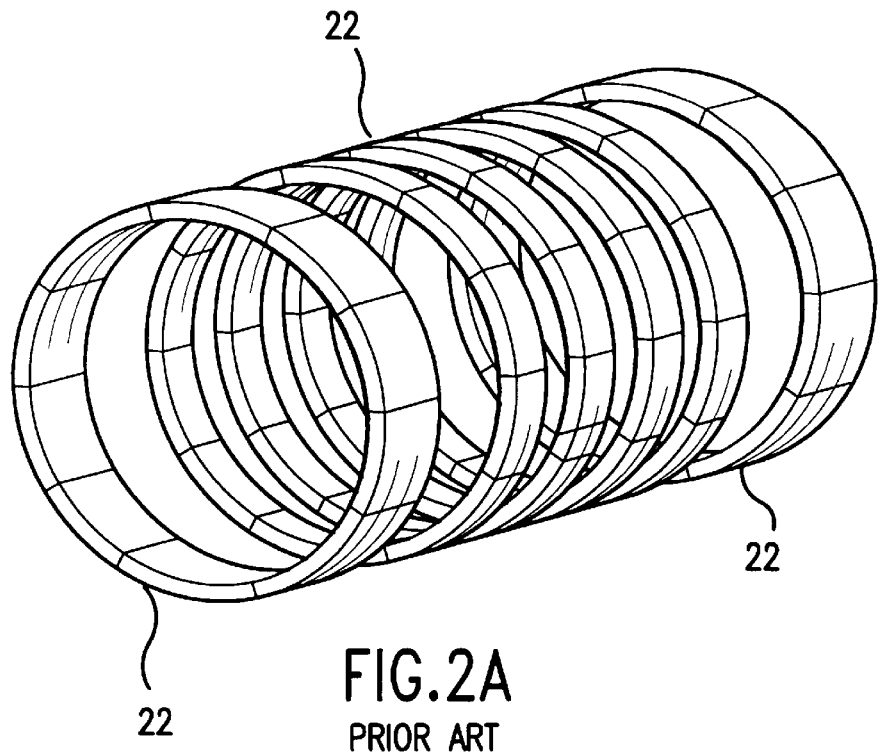
FIGS. 2A and 2B are schematic diagrams of prior art horizontal and vertical primary coils for an NMR machine.
Figure 2B:
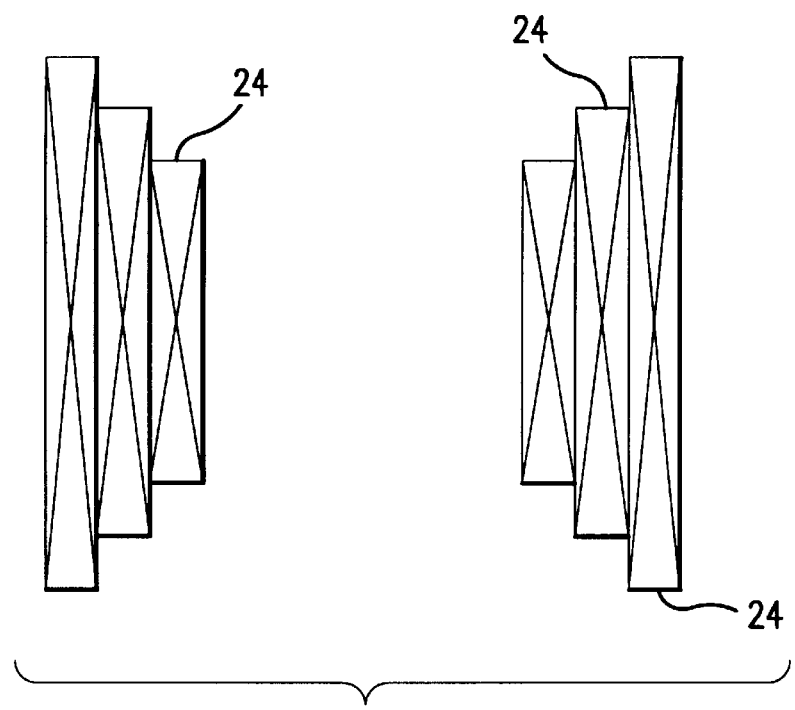

In the case of a superconducting magnet, e.g., magnet 13 in FIG. 1, the field due to the magnet structure was calculated at 450 positions around the magnet centre at 12° azimuthal steps and on 15 longitudinal planes, allowing zonal and tesseral harmonics up to degree and order 14 to be calculated. The axial positions of the 15 planes were given by the radially scaled roots of the Legendre polynomial $P_{15}(\cos\theta)$. The field at these 450 points was calculated by Biot-Savart summations in which each winding was segmented into 100 pieces. The above analysis was then used to deduce the harmonics generated by each magnet configuration.

In the case of gradient and shim magnets, the field due to the magnet was calculated at 112 positions around the magnet centre at 22.5° azimuthal steps and on 7 longitudinal planes, allowing zonal and tesseral harmonics up to degree and order 6 to be calculated. Higher degrees and orders can, of course, be used if desired by increasing the sampling of the homogeneous region. The axial positions of the 7 planes were given by the radially scaled roots of the Legendre polynomial $P_7(\cos\theta)$. The field at these 112 points was calculated by Biot-Savart summations in which each winding was segmented into 100 pieces. Again, this analysis was then used to deduce the harmonics generated by each magnet configuration.

The full field and harmonic deconvolution for the superconducting magnets took on average about 2–3 minutes to run on a Sun SPARCstation 10. The corresponding times for the shim and gradient magnets was about 0.5 minutes. Results of the harmonic deconvolution are typically listed by harmonic "name", a list of some of the more common of which appears in Table 1.

As also shown in box 28 of FIG. 3, the initial guess is used to calculate the fields outside of the magnet to determine the level of shielding provided by any shielding magnets included in the overall magnet design. As with the internal fields, the field values outside of the magnet are calculated using the Biot-Savart equation. Once calculated, a measure of the level of shielding (the "shielding measure") can be obtained by summing field values along one or more lines in the region of the magnet. For example, the level of longitudinal shielding can be determined by summing the field levels along a line parallel to the longitudinal axis and at a distance from that axis at which a 5 gauss field is desired. Similarly, the level of transverse shielding can be determined by summing the field levels along a line orthogonal to the longitudinal axis, again at a distance from the magnet where a 5 gauss field is desired. Either or both of these shielding measures can be used if desired. Similarly, other shielding measures can be used if desired.

At this point in the process, it may be desirable to consider whether the initial guess was reasonable. If the calculated harmonics and shielding measure(s) provide a reasonable starting point for the simulated annealing optimization, then the process proceeds to box 30 of FIG. 3. If not, box 26 can be reexecuted with revised data until a reasonable starting point is obtained. A reasonable starting point, of course, will depend on the properties of the magnet which one desires and will be evident to persons skilled in the art from their knowledge of desirable magnet fields for NMR.

In box 30 of FIG. 3, an annealing schedule and annealing parameters are selected. The considerations which are used in making this selection are discussed below in connection with FIG. 4. Once the schedule and parameters are selected, the simulated annealing is performed until the system becomes "frozen" (box 32 of FIG. 3; see also the discussion of FIG. 4 below). Finally, the result of the optimization is outputted in, for example, magnetic or hard copy form, e.g., graphical or tabular form. Alternatively, the output can be a display of the magnet's structure and the fields which the structure generates on, for example, a workstation monitor.

Using a Sun SPARCstation 10, the simulated annealing procedure can take about 2 hours for a shim or gradient magnet and about 1–2 days for a superconducting magnet.

Thereafter, the magnet can be manufactured using conventional NMR magnet construction techniques known in the art. See, for example, Laukien et al., "Superconducting NMR Magnet Design," *Concepts in Magnetic Resonance*, 6, 255–273, 1994; and Mansfield et al., *NMR in Imaging and Biomedicine*, Academic Press, Orlando, Fla., 1982.

FIG. 4 illustrates a preferred procedure for performing the simulated annealing optimization. As discussed above, simulated annealing is a stochastic optimization method based on Boltzmann statistics that has the potential to find the global minimum of a defined error function in response to system perturbations. See Metropolis N, Rosenbluth A W, Rosenbluth M N and Teller A H 1953 Equations of state calculations by fast computing machines *J. Chem. Phys.* 21 1087–1092; and Kirkpatrick S, Gelatt C D and Vecchi M P 1983 Optimization by simulated annealing *Science* 220 673–680.

In accordance with the invention, simulated annealing is performed by perturbing an array of coils randomly and independently along a constrained length (the magnet length) with the maximum number of windings at each position specified as well as the minimum inter-coil spacing to account for finite wire thickness. (See box 38 of FIG. 4.) Current flow in individual coils can be positive or negative. The spherical harmonics for each perturbation are calculated as described above. (See box 40 of FIG. 4.) The field outside a shielded magnet and its inductance may also be calculated.

A weighted sum of these factors then produces the error function (box 40 of FIG. 4), a preferred form of which is as follows:

$$E = k_1 \frac{\Sigma k_{nm} a_{nm}^2}{|a_{n'm'}|} + k_2 L_t + k_3 \Sigma B_s + k_4 (\mathrm{IN})^2 \tag{8}$$

where the first term is a weighted sum of spherical harmonics, the second term is an inductive term used when a shim or gradient magnet is being designed, the third term is a shielding term used when a shielded magnet of any type is being designed, and the fourth term is a power term, mostly used for shim or gradient magnet design. In computing the first term, the summation does not include (n,m) =(n'm'). Other factors can be included in the error function if desired. The $k_i$'s provide relative weighting between the various terms.

In equation 8, $L_t$ is the total inductance of the magnet, I is the current which flows through all of the windings, and N is the total number of windings in the magnet. $B_S$ is the field outside the shielding magnet and is typically summed at 100 points in the longitudinal direction and, if desired, at an additional 100 points in the transverse direction.

Of critical importance to the design of novel magnets is the first term of the error function. The $k_{nm}$ coefficients of this term provide relative weightings to the spherical harmonic components generated by the magnet. In this way, desired harmonic components can be emphasized and undesirable components de-emphasized.

For example, for a superconducting magnet, it is usually desirable that harmonics above order 4 be more heavily emphasized than lower orders in the error function so that the contribution of these higher orders to the final field will be minimized by the basic design of the magnet. The lower order harmonics may end up to be larger than desired with such an error function, but these harmonics can be compensated for in the shimming process or in further optimization runs. In particular, it is easier to null lower orders by shimming than it is to null higher orders.

Similarly, in the case of a gradient magnet, it is usually desirable that higher odd orders are emphasized in the error function because of their strong impact on the purity of the gradient. Along the same lines, in the case of a shim magnet, it is often desirable to emphasize harmonics on either side of the harmonic to which the shim is directed to increase the purity of the correction. Importantly, by such relative weighting, it is possible to strongly reduce the $B_0$ harmonic of a shim magnet, thereby reducing frequency shifts upon shim activation, an important result which has proved difficult to achieve with prior approaches to the design of shim magnets.

The $a_{n'm'}$ coefficient which appears in the denominator of the first term of the error function serves to further emphasize the most desired harmonic of the magnet which is being designed. Because this coefficient is in the denominator, the error function is reduced when this coefficient increases. Therefore, the simulated annealing process will tend to increase the value of this coefficient. For a superconducting magnet, this coefficient corresponds to the $B_0$ harmonic; for gradient magnets, this is a first order harmonic; and for shim magnets, it can be of any order depending upon the shim under design.

Perturbation of the magnet design can be performed in various ways. A preferred procedure is to change each of the perturbation parameters by a random amount up to a maximum of, for example, 5% of a maximum allowable value for the parameter, each parameter having a different maximum allowable value. For example, in the case of coil locations, the maximum pertubation of any coil location can be constrained to be less than about 6 cm for an overall magnet length of 1.2 meters. Other maximum allowable perturbation values can, of course, be used if desired. It should be noted that if two coils end up to have a substantial overlap as a result of perturbations, it is usually convenient to have the procedure automatically coalesce the two coils into one.

After perturbation of the magnet structure and recalculation of the fields, harmonic components, and error function, a comparison is made between the value of the error function after the perturbation and the value which existed before the perturbation. If the value of the error function after the perturbation is smaller than that before perturbation the new arrangement of the magnet system is accepted (see box 42 of FIG. 4). Positive error excursions are also accepted based on a comparison of a random variable with the pseudo-Boltzmann function $\exp(-dE/T)$, where dE is the change in the error function and T is a "temperature" variable. This procedure of accepting positive error excursions is termed the "Metropolis algorithm" (see box 44 of FIG. 4).

If T is set very high relative to dE then the system will almost never accept positive dE excursions and conversely if T is small, the probability of positive dE acceptance is high. In practice, T is selected to roughly equal the first dE following perturbation of the initial guess. Other selections of T are, of course, possible.

After a set number of perturbations chosen in the annealing schedule (box 30 in FIG. 3), T is lowered and the perturbation is continued (see boxes 48–52 of FIG. 4). Two strategies are used for selecting when T is lowered. The first strategy (box 48 in FIG. 4) counts the number of successful perturbations, i.e., a negative dE or an acceptable positive dE based on the Metropolis algorithm, and lowers T when that number exceeds the predetermined value set in the annealing schedule. The second strategy (box 50 in FIG. 4) simply counts the number of perturbation attempts, whether successful or not, and lowers T when the number of attempts exceeds a predetermined value also set in the annealing schedule. A maximum number of temperatures is also chosen in the annealing schedule, as well as a temperature reduction factor for each temperature drop.

For example, the maximum number of temperatures could be 50, the maximum number of attempts before a temperature drop could be 40, the maximum number of successful perturbations before a temperature drop could be 20, and the temperature reduction factor could be 0.9 times the current temperature. It is important that the temperature be reduced slowly so that the system does not quench (become trapped in a local minimum). At the stage when no successes can be found within the parameters of the annealing schedule at a particular temperature the system is said to be frozen (see box 32 in FIG. 3 and box 60 in FIG. 4).

In order to increase the speed of the computations, adaptive step sizing can be employed in accordance with the procedures discussed in Corana A, Marchesi M, Martini C and Ridella S 1987 Minimizing multimodal functions of continuous variables with the simulated annealing algorithm *ACM Trans. Soft.* 13 262–280. (See box 52 in FIG. 4.) In accordance with this approach, at the end of each temperature cycle the step size is adjusted so as to maintain the ratio of accepted system perturbations to attempted perturbations at approximately 0.5. By means of this approach, it has been found that the speed with which the location of a global minimum is found can be increased by up to 30%.

Boxes 54 and 56 of FIG. 4 represent an optional procedure in which the temperature may be occasionally increased as part of the annealing schedule to ensure that a global minimum is eventually reached. The temperature increase can be, for example, between about 1.1 and about 2.0, e.g., 1.5, of the current temperature and may be performed randomly as the simulated annealing takes place.

The process of the invention as described above is preferably practiced on a digital computer system configured by suitable programming to perform the various computational steps. The programming can be done in various programming languages known in the art. A preferred programming language is the C language which is particularly well-suited to performing scientific calculations. Other languages which can be used include FORTRAN, BASIC, PASCAL, $C^{++}$, and the like. The program can be embodied as an article of manufacture comprising a computer usable medium, such as a magnetic disc, an optical disc, or the like, upon which the program is encoded.

The computer system can comprise a general purpose scientific computer and its associated peripherals, such as the computers and peripherals currently being manufactured by Digital Equipment Corporation, IBM, Hewlett-Packard, Sun MicroSystems or the like.

Preferably, the processing portion of the computer system should have the following characteristics: a processing rate of 25 million floating point operations per second; a word length of 32 bits floating point, at least sixty four megabytes of memory, and at least 100 megabytes of disk storage. As discussed above, the system should include means for inputting data and means for outputting the results of the magnet design both in electronic and visual form. The output can also be stored on a disk drive, tape drive, or the like for further analysis and/or subsequent display.

Without intending to limit it in any manner, the present invention will be more fully described by the following examples. The wire diameter used in the examples was 1 mm. Other diameter wire could, of course, be used if desired. Also, different diameter wires can be used for different coils in the same magnet if desired to, for example, reduce mechanical stresses in the magnet.

EXAMPLE 1

Shielded Superconducting Magnet

Using the simulated annealing procedures described above, a shielded, whole body superconducting magnet of restricted overall length, specifically, 1.12 meters, was designed. The magnet coils were circular in shape and had a specified minimum inner diameter of about 90 cm. The weighting coefficients used in equation 8, the initial guess, and the annealing schedule are set forth in Table 2.

Figure 5:
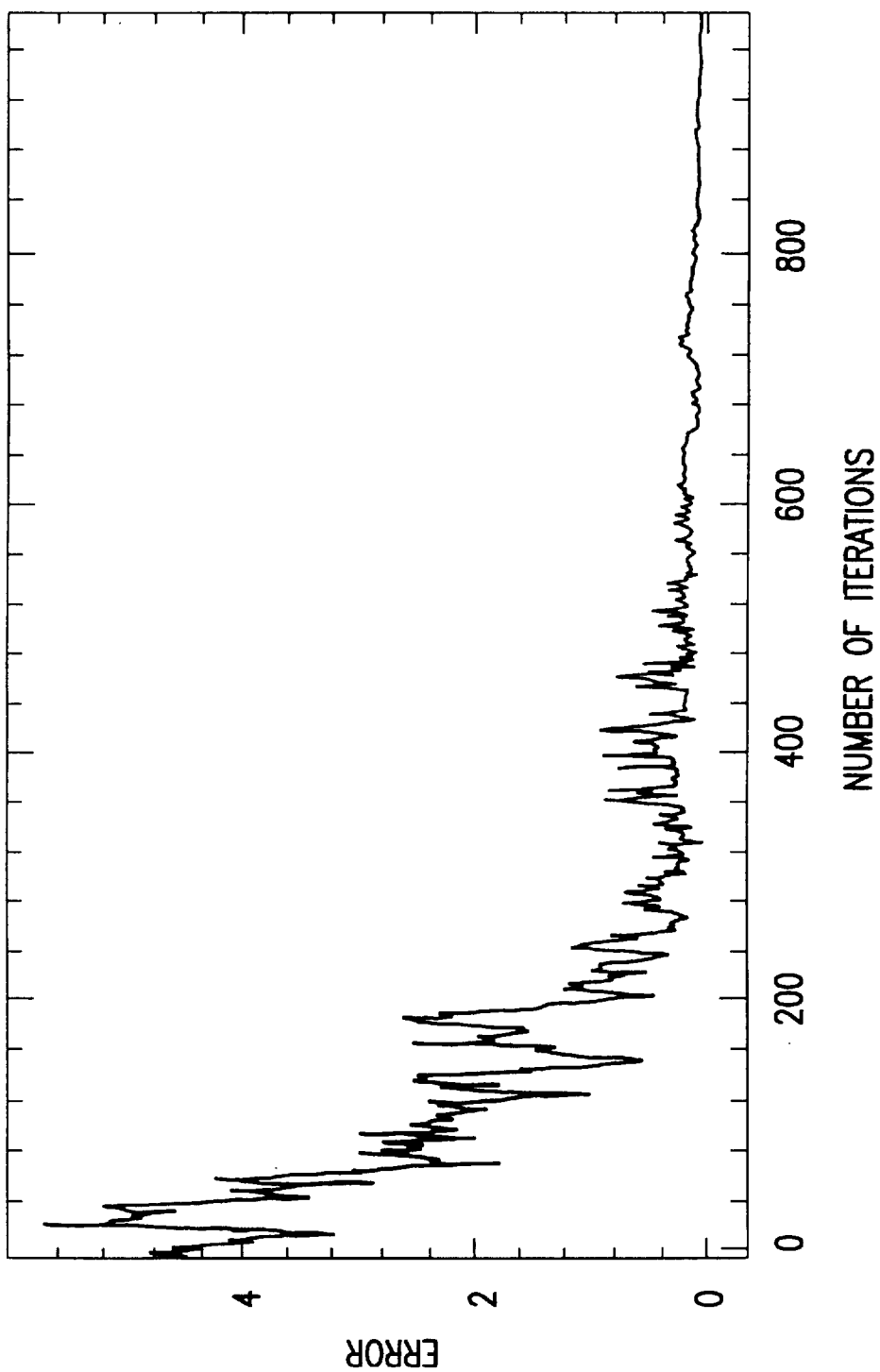
FIG. 5 is a plot of a typical error function versus number of iterations for the simulated annealing procedure of the invention.

FIG. 5 is a plot of the progress of the value of the error function during the optimization process. This figure illustrates the effectiveness of the procedure in reducing the error in a practical number of iterations. It further illustrates the acceptance of positive error excursions needed for the location of a global minimum in the annealing process. It should be noted that the annealing process was performed only on half of the magnet, e.g., the right hand half, in view of the magnet's symmetry about z=0.

Figure 6:
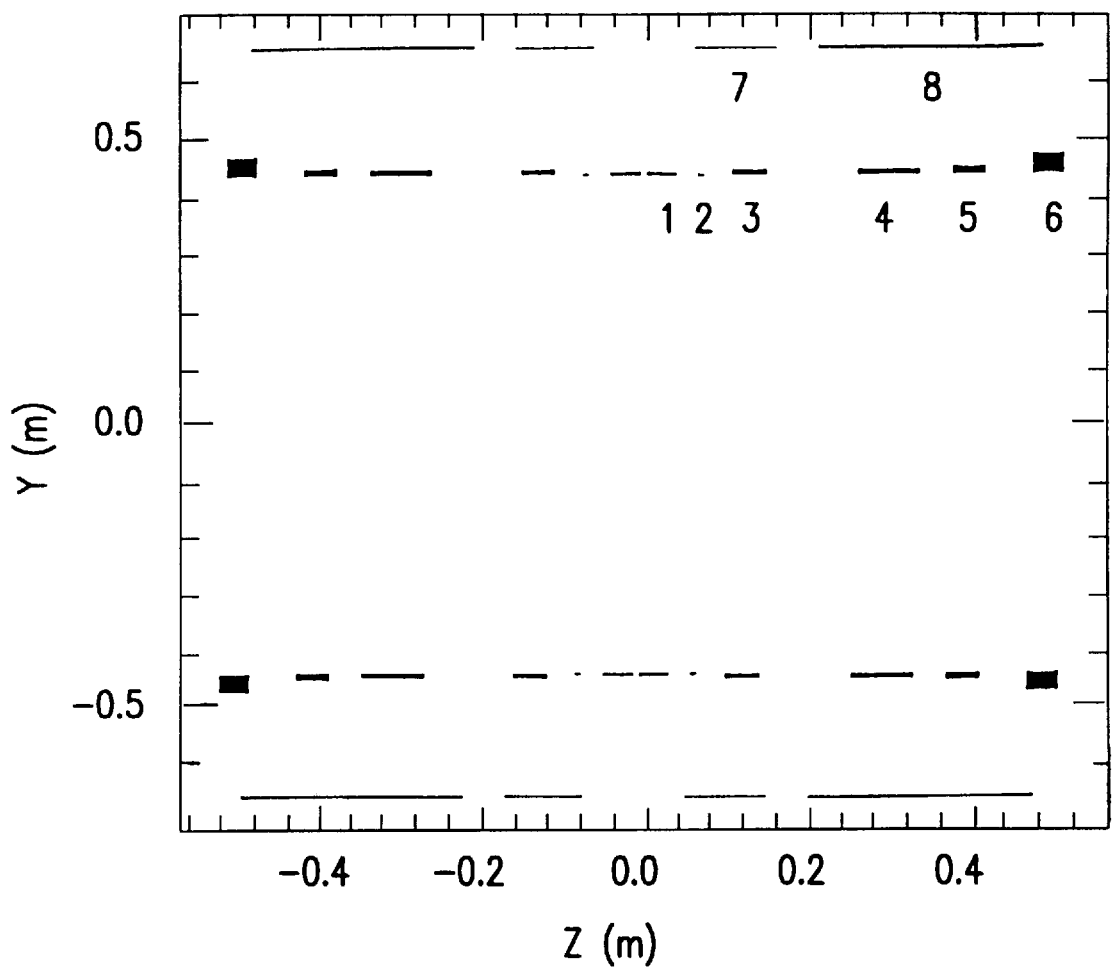
FIG. 6 is a cross-sectional, schematic diagram of a shielded superconducting magnet designed in accordance with the present invention.
Figure 7:
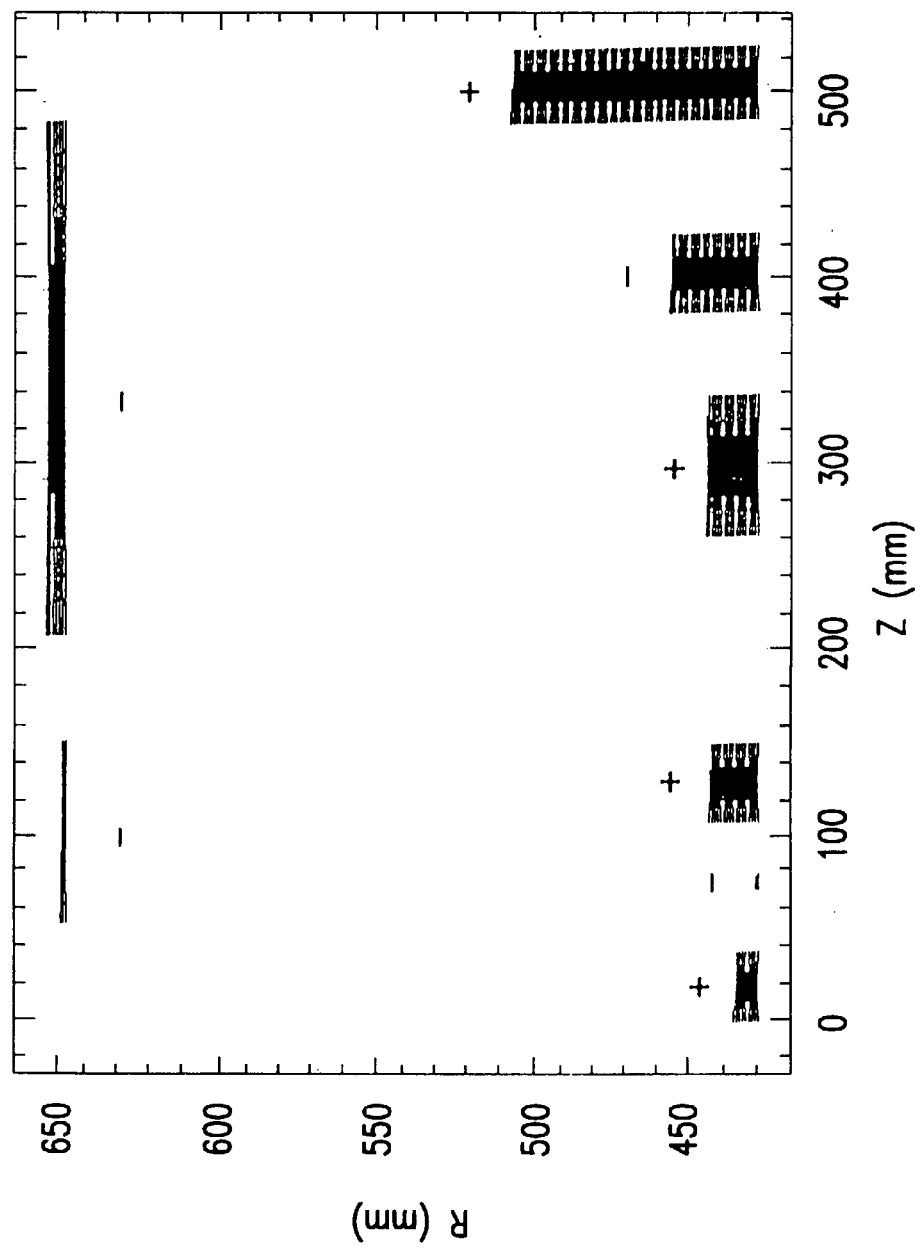
FIG. 7 is an expanded scale view of the upper right hand quadrant of FIG. 6.

FIGS. 6 and 7 show the overall structure of the final magnet design. In particular, FIG. 6 shows that the final design included 12 primary coils and 4 shielding coils. It should be noted that this large number of coils were a result of the simulated annealing procedure and were not designated beforehand.

FIG. 7 shows in greater detail, the upper right quadrant of the full magnet and indicates current flow direction for the various coils. In accordance with the invention, two of the primary coils shown in this figure have a reverse (minus) current flow. In other designs, it has been found that this reversal also occurs in some of the shielding coils as the overall length of the magnet is further reduced, e.g., when the overall length is less than 1.0 meter in a whole body system. Similarly, for short overall lengths, it has been found that the number of coils in the shielding magnet tends to increase, e.g., to more than 4 coils.

The number of windings for the various coils (see FIG. 6 for numbering) were approximately 172, 15, 373, 684, 526, 1347, 123, and 968 for coils 1 to 8, respectively. The magnet was designed on the assumption that the current flowing through the coils was 300 amperes.

Table 3 shows the harmonic deconvolution of the resultant magnet field produced by the magnet of FIGS. 6 and 7 when run at a current of 300 amps and deconvolved over a volume of $45 \times 10^3$ cm$^3$. As shown therein, the homogeneity of the $B_0$ field is less than 20 ppm over this volume even though the magnet's overall length is less than 1.2 meters. This is a surprising result of the simulated annealing procedure of the invention.

The magnet system also exhibits excellent shielding as evidenced by the fact that the 5 gauss stray field location was at about 3.0 meters transversely and 2.5 meters longitudinally from the magnet isocenter, both of which are considered to be reasonably short distances for a whole body superconducting magnet system.

Figure 8:
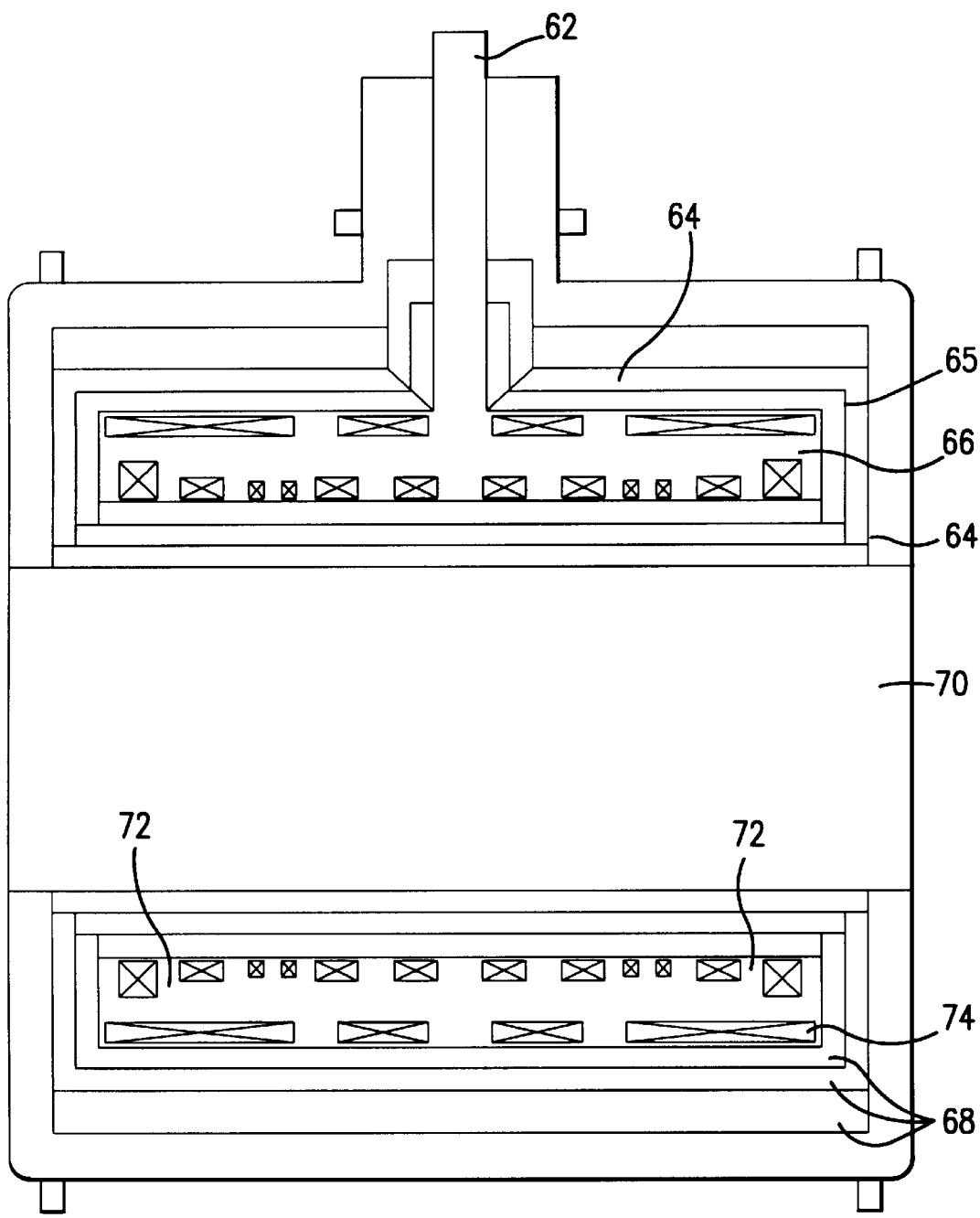
FIG. 8 is a schematic cross-sectional view through a MRI machine designed in accordance with the present invention.

FIG. 8 shows another superconducting magnet design developed in accordance with the simulated annealing procedure of the invention. This figure also shows the relationship of the magnet to the other components normally found in an MRI machine. Specifically, such a machine includes neck tube 62, liquid nitrogen vessels 64, super insulation 65, liquid helium vessels 66, and vacuum chamber 68. The patient aperture is identified by the reference number 70 in this figure, and the primary and shielding coils by 72 and 74, respectively.

EXAMPLE 2

Comparative Example

This example illustrates the importance of using a sum of weighted spherical harmonics in the error function of the simulated annealing procedure as opposed to using an unweighted sum of such harmonics.

Two annealing procedures were performed for a superconducting magnet of the type discussed in Example 1. Table 4 sets forth the weighting coefficients used for the first annealing procedure; for the second annealing procedure, all the weighting coefficients were set equal to 1.0.

Figure 9:
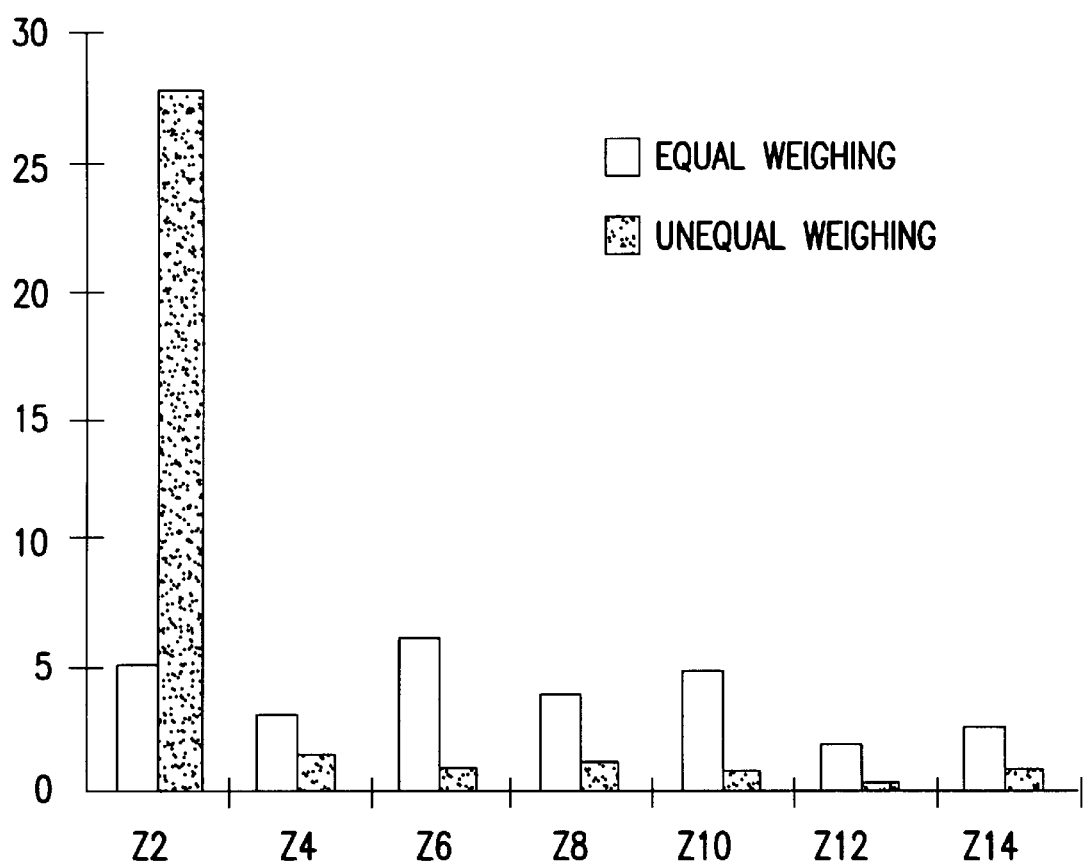
FIG. 9 is a comparative plot of relative strength versus spherical harmonic for a magnet designed using weighted spherical harmonics (darker hatching) and one designed using unweighted spherical harmonics (lighter hatching).

The results of this comparison are shown in FIG. 9, where relative field strength is plotted along the vertical axis and harmonic components along the horizontal axis. As can be seen in this figure, the procedure using weighted coefficients produced smaller strengths for the higher order harmonics than produced by the unweighted procedure, as is desired.

The first procedure produced a Z2 harmonic whose strength was greater than that produced by the second procedure. This harmonic, however, can be easily nulled by a shim magnet. Alternatively, further application of the simulated annealing procedure of the invention can reduce the magnitude of this harmonic without significantly corrupting the values for higher harmonics (see Example 1).

EXAMPLE 3

Biplanar Superconducting Magnet

This example illustrates the design of a biplanar superconducting magnet using the simulated annealing procedures of the invention. As discussed above, such a magnet allows the sample, e.g., the patient, to be introduced into the magnet's homogeneous region along an axis orthogonal to the longitudinal axis of the magnet's coils.

Figure 10A:
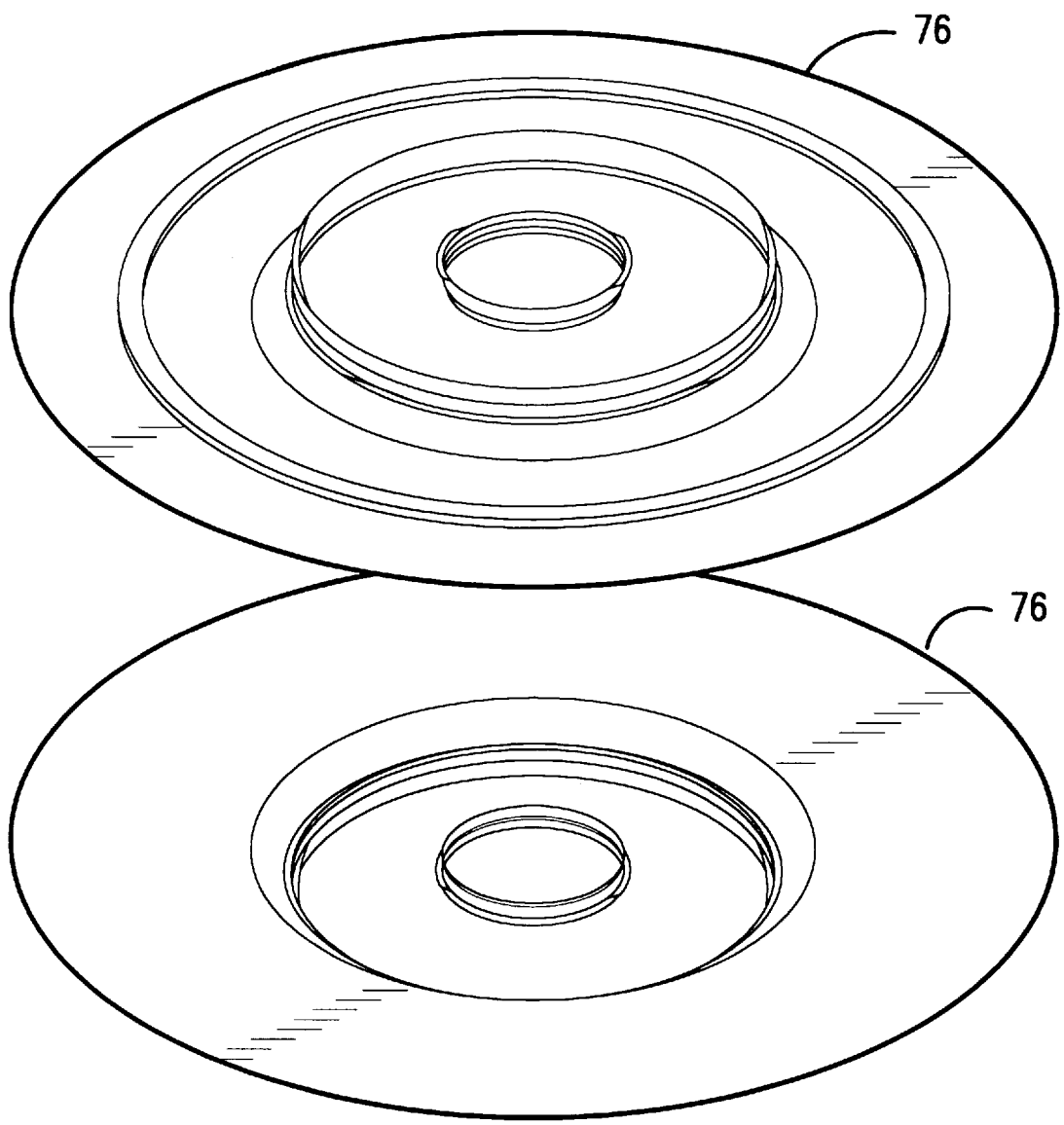
FIGS. 10A and 10B are perspective and cross-sectional view of a biplanar magnet designed in accordance with the invention.
Figure 10B:
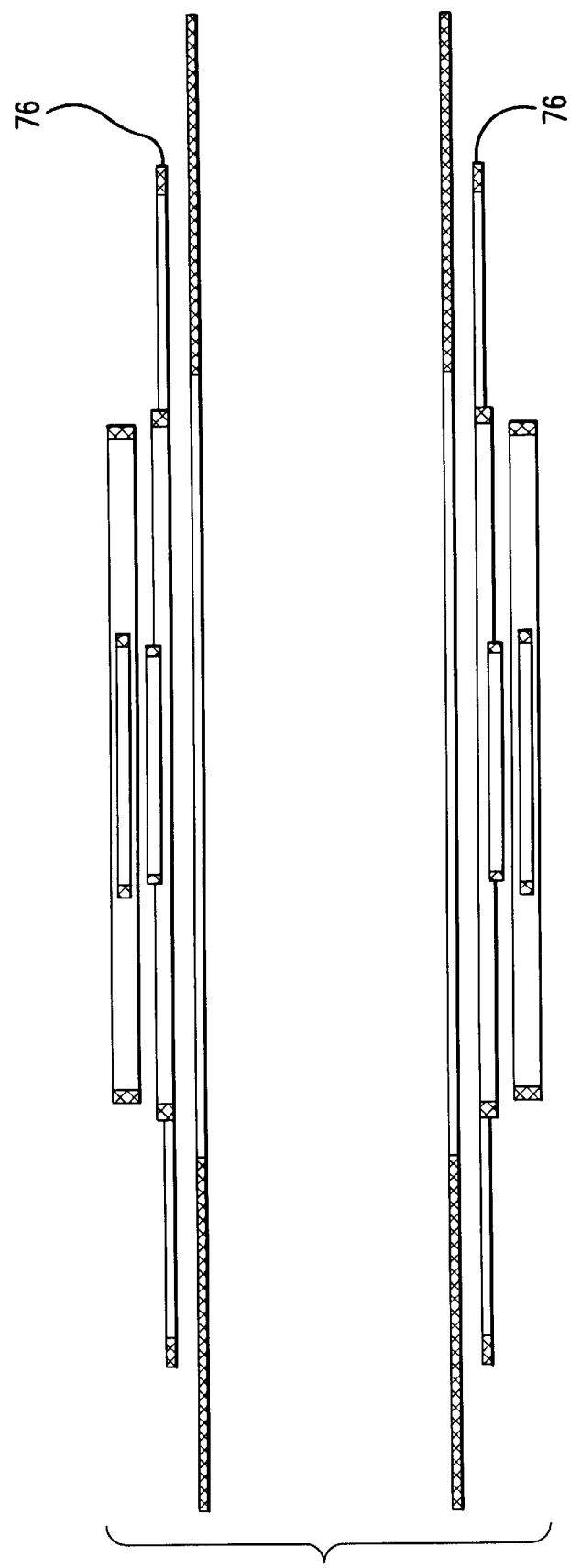

FIGS. 10A and 10B are perspective and cross-sectional views of the resulting magnet coils 76. The dimensions, locations, number of windings, and current directions for the various coils making up the magnet are set forth in Table 5. Only 6 of the 12 coils are described in this table due to the symmetry of the magnet. The terminology used in the table is as follows: "height" refers to the distance from the isocenter to the middle of each coil in the vertical direction; "radius" refers to the radius of the center of each coil; "layers" refers to the number of layers of windings in each coil; and negative windings indicate reversed winding direction, i.e., reversed current flow. As shown in this table, the magnet has an overall height of about 1.4 meters, an aperture height of about 1.1 meters, and a width of about 1.9 meters.

Table 6 shows the performance achieved by the magnet in terms of spherical harmonic components. As shown in this table, the magnet has a homogeneous region (20 ppm in $B_0$) whose volume is approximately $45 \times 10^3$ cm$^3$.

EXAMPLE 4

Shim Magnet

FIGS. 11A to 11D show exemplary wire positions for various shim magnets designed in accordance with the invention. Dots in these figures indicate coils of maximum width 3 mm (i.e., three wires); if there are more than three windings in each coil (i.e., each dot) further layers are wound radially. This distribution is included in the simulated annealing process. Widths other than 3 mm can be chosen depending on the desired properties of the shim magnet under design.

Figure 11A:
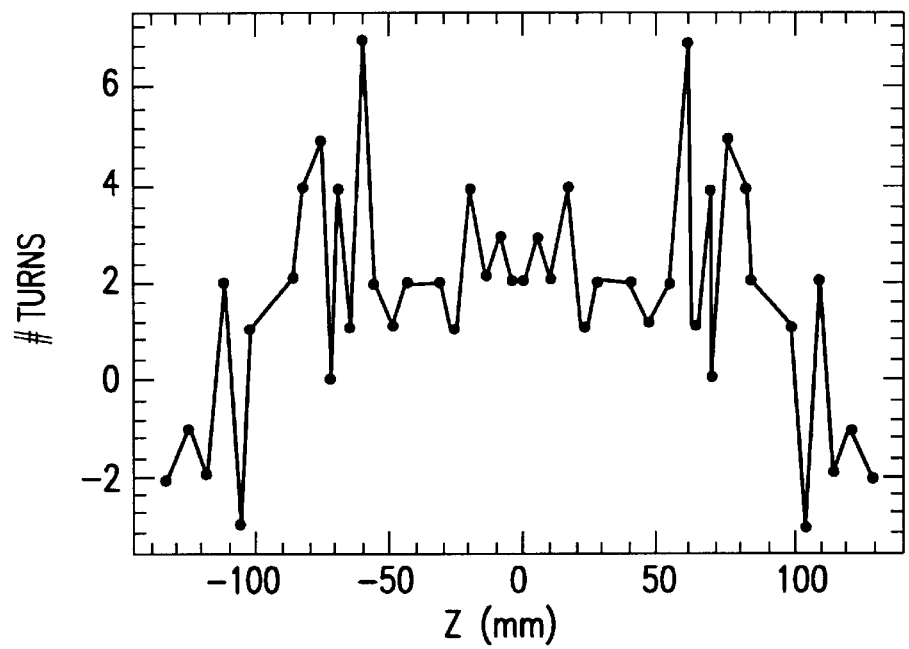
FIGS. 11A–11D show exemplary configurations for various shim magnets designed in accordance with the invention.
Figure 11B:
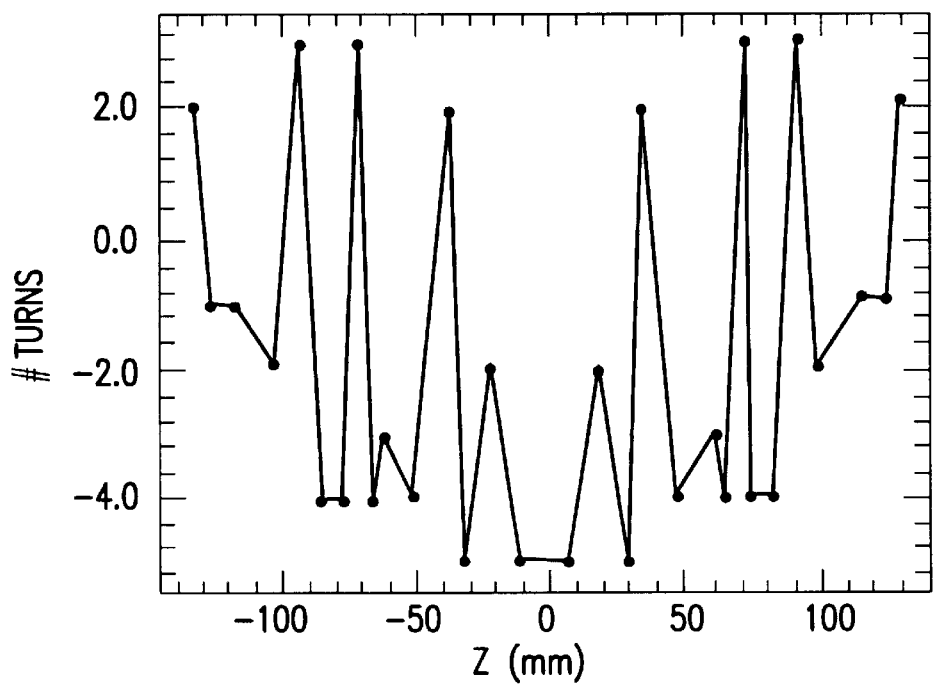
Figure 11C:
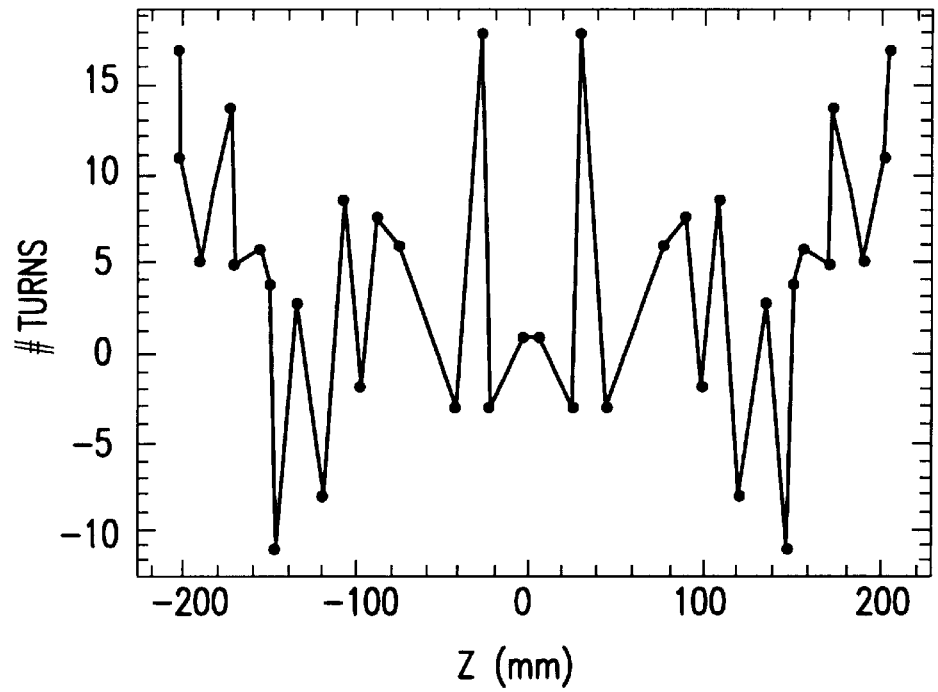
Figure 11D:
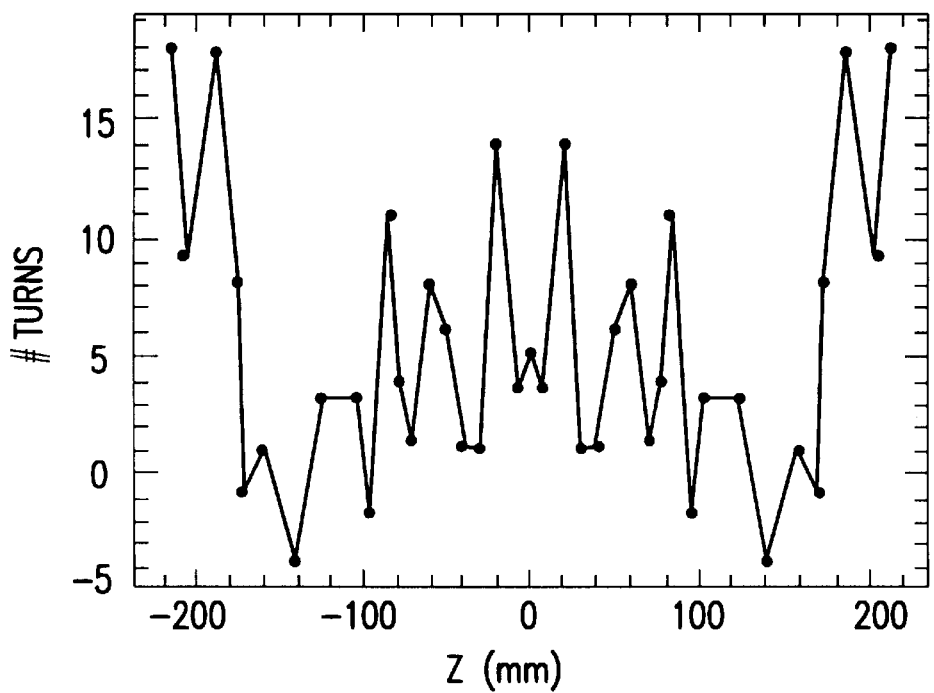

FIG. 11A shows the primary of a Z0 shim, FIG. 11B, the shield for the Z0 shim, FIG. 11C, the primary of a Z2 shim, and FIG. 11D, the primary of a Z4 shim. The technique was also used to design Z1 and Z3 shims. It should be noted that a Z1 shielded shim magnet can be used as a longitudinal gradient magnet.

Table 7 shows the purity of shim magnets designed in accordance with the invention. As shown therein, the magnets exhibit a ratio of about 1,000 or more between the magnitude of the desired harmonic and the sum of the magnitudes of neighboring harmonics. This ratio exists over a region (the "zonal region") whose length/diameter ratio is less than 2. For shim magnets having an overall size suitable for use in whole-body imaging, this level of purity is achieved for zonal regions having volumes greater than $45 \times 10^3$ cubic centimeters.

Figure 12:
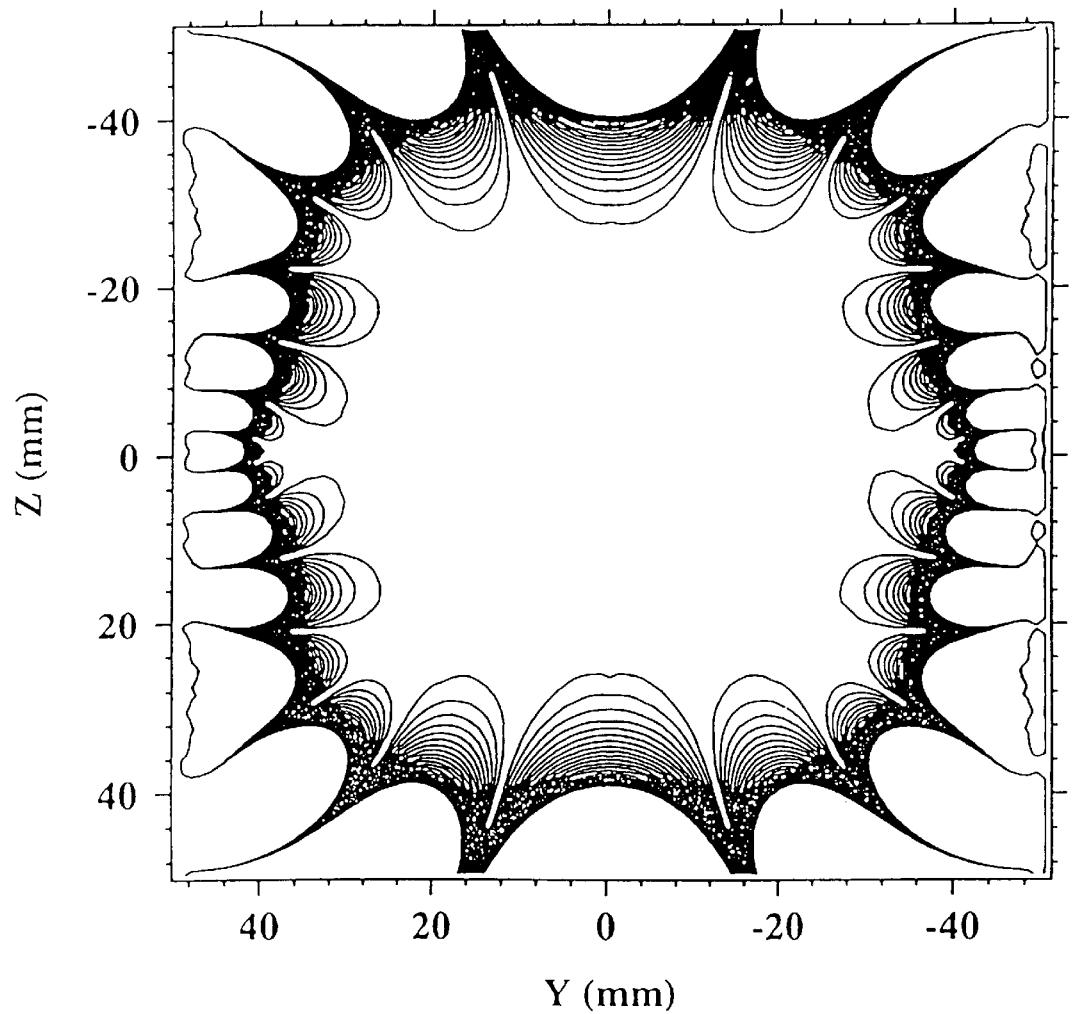
FIG. 12 is a contour plot for a Z0 shim magnet designed in accordance with the invention.

FIG. 12 is a contour plot of field strength for the Z0 shim magnet. The contour levels are shown at 0.01% intervals. The uniformity of the field produced by the magnet and the large volume over which the uniformity is achieved is evident in this figure.

Figure 13:
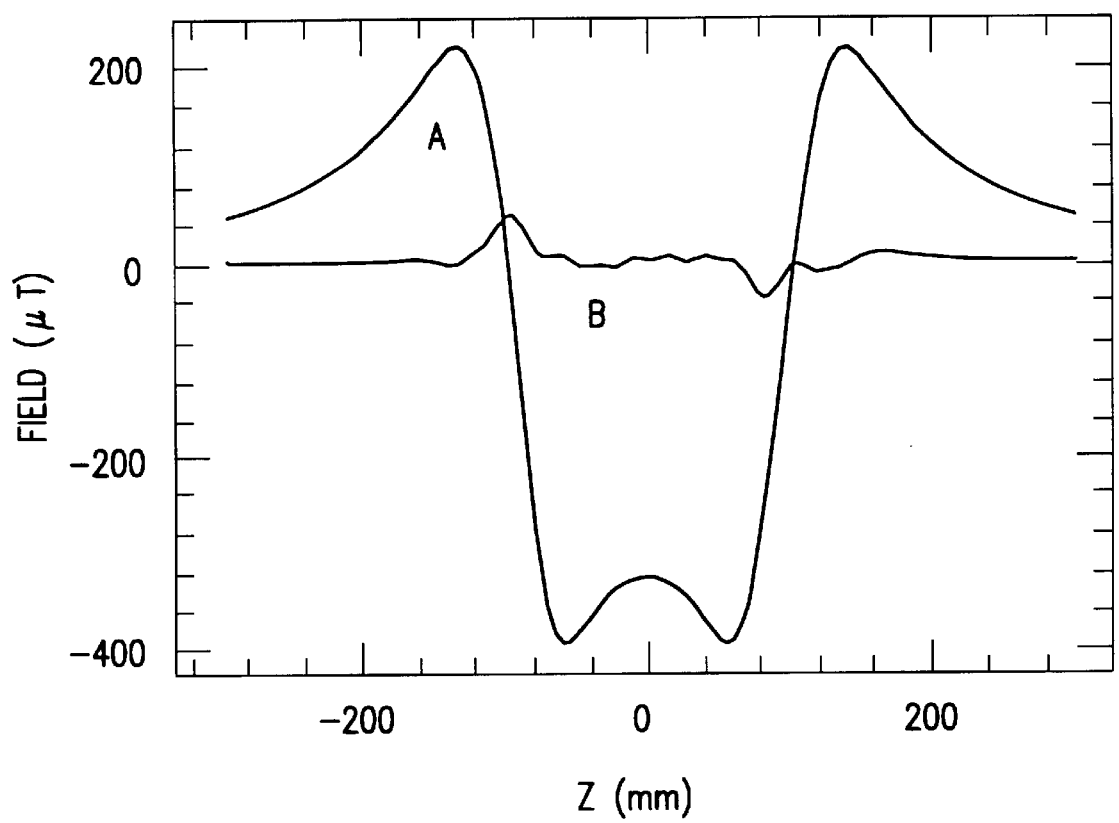
FIG. 13 is a plot of external field strength versus longitudinal axial dimension for a Z0 shim magnet designed in accordance with the invention.

FIG. 13 is a plot of field strength versus longitudinal distance at a radial position of 1.0 cm outside the shield of the Z0 shim magnet. The curve labelled A represents the unshielded field, and the curve labelled B shows the effect of shielding. The dramatic effect of the shielding is evident from these curves. Quantitatively, the calculated ratio of the rms shielded field to the rms unshielded field was less than 2%.

Figure 14:
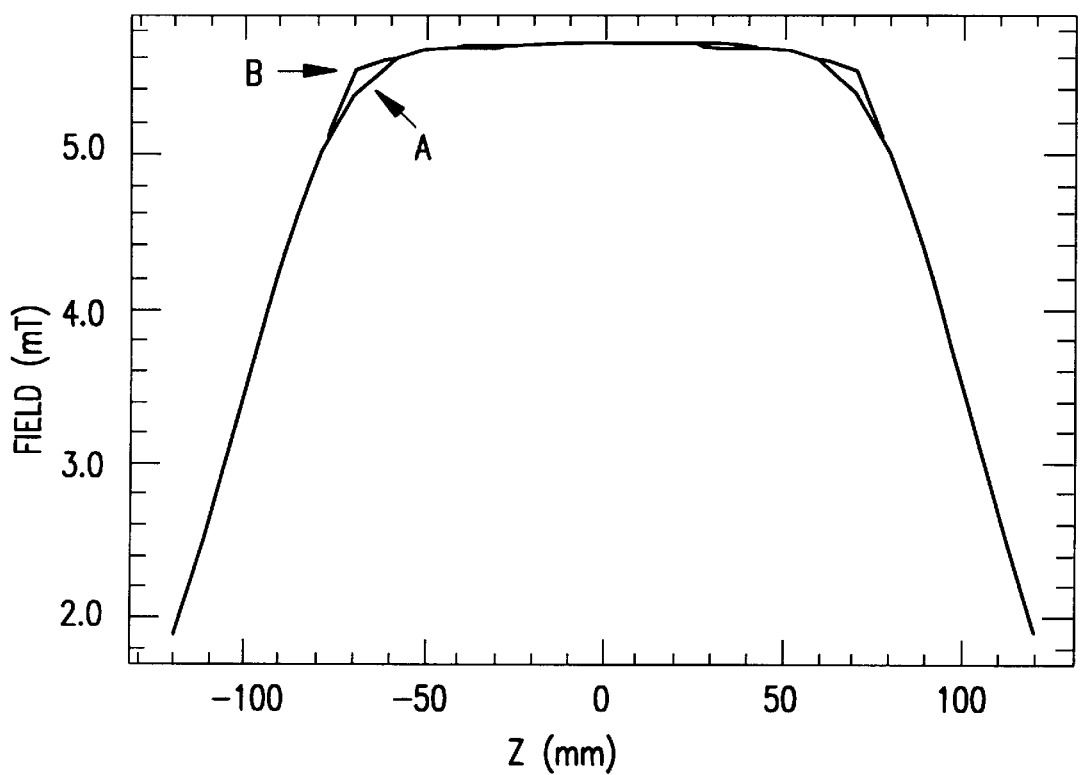
FIG. 14 is a comparative plot showing theoretical (curve A) and experimental (curve B) field strengths along the longitudinal axis of a Z0 shim magnet designed in accordance with the invention.

A Z0 shielded shim magnet was constructed as per the winding arrangements of FIGS. 11A and 11B using conventional magnet construction techniques. FIG. 14 shows a comparison of the predicted (curve A) and measured (curve B) field strengths along the longitudinal axis of the magnet. As can be clearly seen, the theoretical and actual field strengths are substantially the same. Quantitatively, the rms deviation of the difference between the two curves was less than 1%. The shielding achieved by the constructed magnet was also measured with the shielding coils active and not active. The measured ratio of the rms shielded field to the rms unshielded field was 2.4%, which compares closely with the calculated 2.0% value discussed above.

EXAMPLE 5

Shielding Magnet

As discussed above in Example 1, it has been found that as the length of a shielded superconducting magnet is made shorter, the simulated annealing technique of the invention results in magnet designs having (1) increased numbers of shielding coils and (2) shielding coils with reversed current flows.

Figure 15:
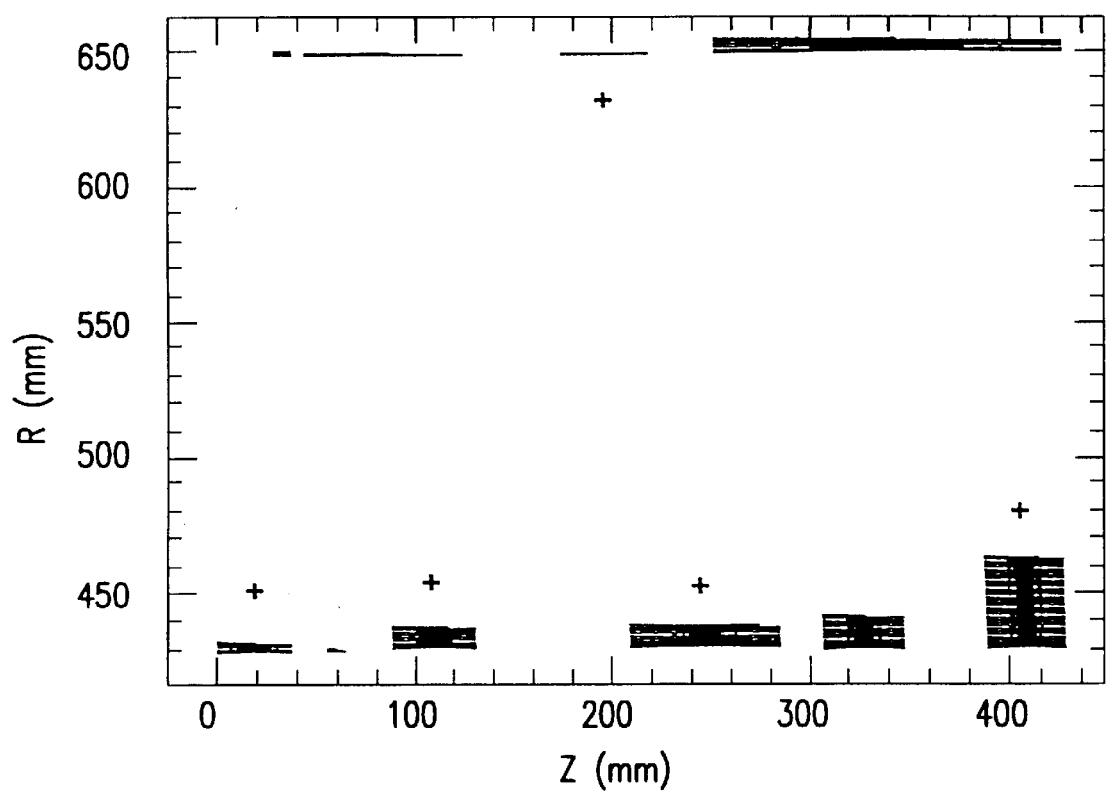
FIG. 15 is a cross-sectional, schematic diagram of the upper right hand quadrant of a shielded superconducting magnet designed in accordance with the present invention.

FIG. 15 illustrates these effects for an initial design of a short superconducting magnet. As in FIG. 7, FIG. 15 shows only the upper right hand quadrant of the magnet. The coils having positive current flows are indicated by plus signs in this figure. All other coils have negative current flows.

As shown in FIG. 15, the techniques of the invention have resulted in a shielding coil design which for the full magnet employs 8 coils, two of which have positive current flows, i.e., current flows opposite to the normal current flow direction for a shielding magnet. As noted in FIGS. 6–8 and 15, the primary magnet has a non-stacked configuration, i.e., a single layer of primary coils, rather than multiple layers.

Although preferred and other embodiments of the invention have been described herein, further embodiments may be perceived by those skilled in the art without departing from the scope of the invention as defined by the following claims.

TABLE 1

| Order (n) | Degree (m) | Function | Name |
|---|---|---|---|
| 1 | 0 | Z | Z |
| 2 | 0 | $Z^2 - (X^2 + Y^2)$ | $Z^2$ |
| 3 | 0 | $Z[2Z^2 - 3(X^2 + Y^2)]$ | $Z^3$ |
| 4 | 0 | $8Z^2[Z^2 - 3(X^2 + Y^2)] + 3(X^2 + Y^2)^2$ | $Z^4$ |
| 5 | 0 | $48Z^3[Z^2 - 5(X^2 + Y^2)] + 90Z(X^2 + Y^2)^2$ | $Z^5$ |
| 1 | 1c | X | X |
| 1 | 1s | Y | Y |
| 2 | 1c | ZX | ZX |
| 2 | 1s | ZY | ZY |
| 3 | 1c | $X[4Z^2 - (X^2 + Y^2)]$ | $Z^2X$ |
| 3 | 1s | $Y[4Z^2 - (X^2 + Y^2)]$ | $Z^2Y$ |
| 2 | 2c | $X^2 - Y^2$ | $X^2 - Y^2$ |
| 2 | 2s | XY | XY |
| 3 | 2c | $Z(X^2 - Y^2)$ | $Z(X^2 - Y^2)$ |
| 3 | 2s | ZXY | ZXY |
| 3 | 3c | $X(X^2 - 3Y^2)$ | $X^3$ |
| 3 | 3s | $Y(3X^2 - Y^2)$ | $Y^3$ |

The subscript "c" or "s" on the degree numbers indicates either cosine or sine azimuthal dependence.

TABLE 2A

| | | | | Weighting Factors | | | | | | |
|---|---|---|---|---|---|---|---|---|---|---|
| $k_1$ | $k_{2,0}$ | $k_{4,0}$ | $k_{6,0}$ | $k_{8,0}$ | $k_{10,0}$ | $k_{12,0}$ | $k_{14,0}$ | $k_2$ | $k_3$ | $k_4$ |
| 1.0 | 0.2 | 0.4 | 0.7 | 0.8 | 1.0 | 1.0 | 1.0 | 0.0 | 0.8 | 0.1 |

TABLE 2B

| | Initial Guess* | | | |
|---|---|---|---|---|
| Coil # | Axial Position (mm) | Width of Coil (mm) | Number of Turns | Base Radius (mm) |
| 1 | 30 | 40 | 100 | 430 |
| 2 | 70 | 10 | 50 | 430 |
| 3 | 100 | 40 | 100 | 430 |
| 4 | 150 | 20 | 100 | 430 |
| 5 | 250 | 40 | 600 | 430 |
| 6 | 300 | 40 | 400 | 430 |
| 7 | 400 | 40 | 1000 | 430 |
| 8 | 100 | 80 | −150 | 647 |
| 9 | 350 | 120 | −850 | 647 |

*Axial position refers to the middle of each coil. Base radius refers to the radius on which the wire sits.

TABLE 2C

| Annealing Schedule* | |
|---|---|
| Maximum Number of Temperatures Tried | 50 |
| Maximum Number of Tries at Each Temperature | 40 |
| Maximum Number of Successful Perturbations Before Temperature Reduction | 20 |
| Temperature Reduction Parameter | 0.9 |
| Initial Temperature | 2 |
| Initial Step Size for Windings Per Coil | 4% |
| Initial Step Size for Axial Position | 2% |
| Initial Step Size for Radial Position | 1.5% |
| Initial Step Size for Width of Coil | 1% |
| Initial Number of Coils | 20 |
| Coalesce Coils if Overlap | yes |
| Step Adaptation | yes |
| Random Temperature Restart | yes |
| Restart Temperature Factor | 1.5 |
| Number of Restarts | 4 |

*All initial step percentages refer to the physical constraints placed on each of the respective perturbation parameters.

TABLE 3

| Harmonic | DSV-45 cm (ppm) |
|---|---|
| $Z_2$ | −2.1 |
| $Z_4$ | −0.19 |
| $Z_6$ | −0.8 |
| $Z_8$ | 1.9 |
| $Z_{10}$ | 3.8 |
| $Z_{12}$ | −4.5 |
| $Z_{14}$ | 2.9 |
| $Z_0$ (@ 300 A) | 0.45T |
| half length | 560 mm |

DSV refers to the diameter of the homogeneous region.

TABLE 4

Weighting Factors

| $k_1$ | $k_{2,0}$ | $k_{4,0}$ | $k_{6,0}$ | $k_{8,0}$ | $k_{10,0}$ | $k_{12,0}$ | $k_{14,0}$ | $k_2$ | $k_3$ | $k_4$ |
|---|---|---|---|---|---|---|---|---|---|---|
| 1.0 | 0.1 | 0.8 | 0.8 | 0.8 | 1.0 | 1.0 | 1.0 | 0.0 | 0.0 | 0.0 |

TABLE 5

| Coil # | Height (mm) | Radius (mm) | Layers | Number of Windings |
|---|---|---|---|---|
| 1 | 591.9 | 975.4 | 9.1 | 4187 |
| 2 | 630.1 | 781.5 | 13.7 | −442 |
| 3 | 634.2 | 465.3 | 16.9 | 297 |
| 4 | 675.5 | 440.2 | 31.3 | −372 |
| 5 | 644.1 | 156.1 | 16.1 | 74 |
| 6 | 682.3 | 172.3 | 17.6 | 265 |

TABLE 6

| Harmonic | DSV-45 cm (ppm) |
|---|---|
| $Z_2$ | 6.4 |
| $Z_4$ | 1.3 |
| $Z_6$ | −3.6 |
| $Z_8$ | 0.41 |
| $Z_{10}$ | 0.67 |
| $Z_{12}$ | −2.1 |
| $Z_{14}$ | −5.9 |
| $Z_0$ (@ 300 A) | 1.0T |

DSV refers to the diameter of the homogeneous region.

TABLE 7

| Zonal Harmonic name | Z0 Value (mT) | Z1 Value (mT) | Z2 Value (mT) | Z3 Value (mT) | Z4 Value (mT) |
|---|---|---|---|---|---|
| Z0 | 100.0 | 0.0 | −0.035 | 0 | 0.104 |
| Z1 | 0 | 100.0 | 0.004 | 0.135 | 0 |
| Z2 | 0.158 | 0 | 100.0 | 0 | 0.297 |
| Z3 | 0 | −0.189 | 0.0007 | 100.0 | 0 |
| Z4 | −0.185 | 0 | −0.146 | 0 | 100.0 |
| Z5 | 0 | −0.029 | 0 | −0.12 | 0 |
| Z6 | 0.0206 | 0 | 0.017 | 0 | 0.085 |

All deconvolutions have been normalized to 100 for the dominant harmonic. Tesseral harmonics are not shown as they were all $<10^{-4}$.

What is claimed is:

1. A magnetic resonance system comprising a superconducting primary magnet which produces a magnetic field which is substantially homogeneous over a predetermined region (the "homogeneous region") whose volume is greater than $40\times10^3$ cubic centimeters, said magnet having a longitudinal axis and comprising a plurality of current carrying primary coils which surround the axis, wherein (i) the primary coils have a non-stacked configuration, (ii) the primary coils have a common inner radius, (iii) the primary coils are wound such that the current in at least one of the primary coils is in an opposite direction to the current in an adjacent primary coil, (iv) the current in at least one of the primary coils is in the same direction as the current in an adjacent primary coil, (v) the length of the primary magnet along the longitudinal axis is less than 1.5 meters, and (vi) the variation of the magnet field in the homogeneous region is less than 20 parts per million prior to any shimming.

2. The magnetic resonance system of claim 1 wherein the length of the primary magnet along the longitudinal axis is less than 1.2 meters.

3. A magnetic resonance system comprising a superconducting primary magnet which produces a magnetic field which is substantially homogeneous over a predetermined region (the "homogeneous region") whose volume is greater than $40\times10^3$ cubic centimeters, said magnet having a longitudinal axis and comprising a plurality of current carrying primary coils which surround the axis, wherein (i) the primary coils have a non-stacked configuration, (ii) the primary coils are wound such that the current in at least one of the primary coils is in an opposite direction to the current in an adjacent primary coil, (iii) the current in at least one of the primary coils is in the same direction as the current in an adjacent primary coil, (iv) the length of the primary magnet along the longitudinal axis is less than 1.2 meters, and (v) the variation of the magnet field in the homogeneous region is less than 20 parts per million prior to any shimming.

4. The magnetic resonance system of claim 1, 2, or 3 wherein the homogeneous region has a volume which is greater than $45\times10^3$ cubic centimeters.

5. The magnetic resonance system of claim 1 or 3 wherein the number of primary coils is greater than six.

6. The magnetic resonance system of claim 1 or 3 wherein the system comprises a plurality of current carrying shielding coils which surround the primary magnet and wherein the shielding coils are wound such that the current in at least one of the shielding coils is in an opposite direction to the current in at least one other of the shielding coils.

7. The magnetic resonance system of claim 6 wherein the overall length of the shielding coils along the longitudinal axis is no longer than the overall length of the primary magnet along said axis.

8. The magnetic resonance system of claim 1 or 2 wherein the system comprises a plurality of current carrying shielding coils which surround the primary magnet and wherein the number of shielding coils is greater than four.

9. The magnetic resonance system of claim 8 wherein the overall length of the shielding coils along the longitudinal axis is no longer than the overall length of the primary magnet along said axis.

10. A method for improving the homogeneity of the magnetic field produced by the primary magnet of a magnetic resonance system, said primary magnet comprising a plurality of primary coils, said method comprising (i) arranging the primary coils to have a common inner radius, a non-stacked configuration, and an overall length of less than 1.5 meters, (ii) causing the current in at least one of the primary coils to flow in an opposite direction to the current in an adjacent primary coil, and (iii) causing the current in at least one of the primary coils to flow in the same direction as the current in an adjacent primary coil so that the magnetic field of said primary magnet has a variation which is less than 20 parts per million prior to any shimming over a volume which is greater than $40 \times 10^3$ cubic centimeters.

11. A magnetic resonance system comprising:

a superconducting primary magnet having a longitudinal axis and comprising a plurality of current carrying primary coils which surround the axis, wherein (i) the primary coils have a non-stacked configuration, (ii) the primary coils are wound such that the current in at least one of the primary coils is in an opposite direction to the current in an adjacent primary coil, and (iii) the current in at least one of the primary coils is in the same direction as the current in an adjacent primary coil; and a superconducting shielding magnet comprising a plurality of current carrying shielding coils which surround the primary magnet, wherein (i) the current in at least one of the shielding coils is in an opposite direction to the current in an adjacent shielding coil, and (ii) the shielding coils are wound such that the current in at least one of the shielding coils is in the same direction as the current in an adjacent shielding coil.

12. The magnetic resonance system of claim 11 wherein the number of primary coils is greater than six.

13. The magnetic resonance system of claim 11 wherein the number of shielding coils is greater than four.

14. The magnetic resonance system of claim 11 wherein the overall length of the shielding coils along the longitudinal axis is no longer than the overall length of the primary magnet along said axis.

15. The magnetic resonance system of claim 14 wherein the overall length of the primary magnet along the longitudinal axis is less than 1.5 meters.

16. The magnetic resonance system of claim 14 wherein the overall length of the primary magnet along the longitudinal axis is less than 1.2 meters.

17. A method for improving the homogeneity of the magnetic field produced by the primary magnet of a magnetic resonance system, said primary magnet comprising a plurality of primary coils, said method comprising (i) arranging the primary coils to have a non-stacked configuration and an overall length of less than 1.2 meters, (ii) causing the current in at least one of the primary coils to flow in an opposite direction to the current in an adjacent primary coil, and (iii) causing the current in at least one of the primary coils to flow in the same direction as the current in an adjacent primary coil so that the magnetic field of said primary magnet has a variation which is less than 20 parts per million prior to any shimming over a volume which is greater than $40 \times 10^3$ cubic centimeters.

* * * * *

UNITED STATES PATENT AND TRADEMARK OFFICE
CERTIFICATE OF CORRECTION

PATENT NO.   : 5,818,319
DATED        : October 6, 1998
INVENTOR(S)  : Stuart Crozier and David M. Doddrell It is certified that error appears in the above-identified patent and that said Letters Patent is hereby corrected as shown below:

Column 18,
Line 7, "that the" should read -- that (a) the --
Line 9, "coil, (iv) the" should read -- coil, and (b) the --
Line 11, "coil, (v) the" should read -- coil, (iv) the --
Line 12, "1.5 meters, and (vi)" should read -- 1.5 meters, and (v) --
Line 26, "such that the" should read -- such that (a) the --
Line 28, "coil, (iii) the" should read -- coil, and (b) the --
Line 30, "coil, (iv) the" should read -- coil, (iii) the --
Line 31, "and (v) the" should read -- and (iv) the --
Line 49, "claim 1 or 2" should read -- claim 1 or 3 --

Column 19,
Line 8, "configuration, (ii)" should read -- configuration, and (ii) --
Line 9, "such that the" should read -- such that (a) the --
Line 11, "and (iii) the" should read -- and (b) the --
Line 16, "wherein (i)" should read -- wherein the shielding coils are wound such that (i) --
Lines 18 and 19, "(ii) the shielding coils are wound such that the current" should read -- (ii) the current --

Signed and Sealed this

Twenty-third Day of December, 2003

JAMES E. ROGAN
*Director of the United States Patent and Trademark Office*